United States Patent [19]
Woods

[11] Patent Number: 6,124,767
[45] Date of Patent: Sep. 26, 2000

[54] RF/MICROWAVE OSCILLATOR

[75] Inventor: Donnie W. Woods, Thousand Oaks, Calif.

[73] Assignee: Delphi Components, Inc., Newbury Park, Calif.

[21] Appl. No.: 09/352,978

[22] Filed: Jul. 14, 1999

Related U.S. Application Data

[63] Continuation-in-part of application No. 09/082,805, May 21, 1998, Pat. No. 6,011,446.

[51] Int. Cl.[7] ........................................ H03B 5/18
[52] U.S. Cl. ..................... 331/117 D; 331/96; 331/99; 331/117 FE; 331/175; 331/177 R; 331/177 V
[58] Field of Search ............................. 331/96, 99, 100, 331/107 SL, 117 R, 117 FE, 117 D, 175, 177 R, 177 V, 181

[56] References Cited

U.S. PATENT DOCUMENTS

| | | | |
|---|---|---|---|
| 3,721,918 | 3/1973 | Rosen et al. | |
| 4,189,690 | 2/1980 | Bock et al. | 332/30 |
| 4,310,809 | 1/1982 | Buck et al. | 331/117 |
| 4,484,156 | 11/1984 | Khanna et al. | 331/60 |
| 4,494,086 | 1/1985 | Dydyk | 331/96 |
| 4,518,931 | 5/1985 | Rauscher | 331/76 |
| 4,630,004 | 12/1986 | Niehenke et al. | 331/107 |
| 4,639,691 | 1/1987 | Iigima | 331/99 |
| 4,660,002 | 4/1987 | Iijima et al. | 332/16 |
| 4,736,454 | 4/1988 | Hirsch | 455/129 |
| 5,079,524 | 1/1992 | Sugawara | 331/96 |
| 5,483,206 | 1/1996 | Lohninger | 331/107 |
| 5,648,747 | 7/1997 | Grothe et al. | 333/204 |

*Primary Examiner*—David Mis
*Attorney, Agent, or Firm*—Blakely, Sokoloff, Taylor & Zafman LLP

[57] ABSTRACT

An RF/Microwave oscillator is disclosed that has the high-Q, low-loss, and phase noise performance of a DRO, without the need of a dielectric resonator to achieve such performance. The RF/Microwave oscillator includes a field effect transistor having a drain coupled to an output circuit, a source coupled to a series feedback circuit, and a gate coupled to a resonator circuit. Each of these circuits are comprised of cascaded pairs of coupled transmission lines designed to resonate at the operating frequency of the oscillator. The RF/Microwave oscillator may also include a frequency-adjustable bias circuit, a frequency-adjustable FET gate return, and a frequency tuning circuit.

10 Claims, 9 Drawing Sheets

RF/MICROWAVE OSCILLATOR

CROSS-REFERENCE TO RELATED APPLICATION

This application is a continuation-in-part of patent application Ser. No. 09/082,805 filed on May 21, 1998, now U.S. Pat. No. 6,011,446 which is incorporated herein by reference for all purposes. In addition, this application is related to application entitled "Dielectric Resonator Tuning Device" filed on even date, which is incorporated herein by reference for all purposes.

FIELD OF THE INVENTION

This invention relates generally to radio frequency or microwave circuits, and specifically to techniques for improving the direct current (DC) biasing of oscillators, amplifiers, and other RF/Microwave devices; for improving the gate return for a field effect transistor used in an oscillator; for providing a cavity or enclosure for a dielectric resonator that provides improved temperature stability over a wide frequency range; for providing an improved microwave oscillator; and for providing an improved dielectric resonator tuning device.

BACKGROUND OF THE INVENTION

Frequency-Adjustable DC Biasing Circuit

Dielectric resonator oscillators (DROs) are very popular devices in the radio frequency (RF) or microwave electronic field. These oscillators are typically employed in communication systems, radar systems, navigation systems and other signal receiving and/or transmitting systems. Their popularity has been attributed to their high-Q, low loss, and conveniently sized devices for various applications in the RF and microwave fields. For the purpose of this application, the terms "radio frequency", "RF" and "microwave" are interchangeable, and are used to refer to the field of electronics that involve signal processing of electromagnetic energy cycling at a frequency range of about 800 MHz to about 300 GHz.

Although DROs provide substantial advantages over other types of oscillator designs, improving their performance and characteristics is an ongoing process. For instance, some ongoing developments include reducing the size of the DROs, increasing its efficiency, improving its manufacturing and reliability, reducing its phase noise, and improving its temperature stability. Of particular interest to this invention is the latter three objectives.

Manufacturers of DROs are concerned with improving the manufacturing and reliability of their products. The design of DROs presents a particular problem in that DROs typically perform well only for an RF energy or signal cycling at a discreet frequency or within a narrow frequency range. In other words, they generally meet their specified performance only for a very narrow frequency range. It follows then that if a DRO manufacturer wants to produce a line of DROs with different discreet output frequencies covering a wide frequency range, each DRO must be custom tailored for each of the frequencies. This custom tailoring of DROs leads to increased engineering time, manufacturing time, cost, inventory and logistics, and a reduction in the reliability of the DROs.

To illustrate the manufacturing and reliability problem of customizing DROs, consider the typical prior art series feedback or reflective type DRO 10 shown in FIG. 1. The DRO 10 consists of a dielectric resonator (DR) 12, field effect transistor (FET) 14, a DR-coupling or input resonator transmission line 16, output and source impedance matching circuits 18 and 20, direct current (DC) biasing circuits 22 and 24 for the drain and source of the FET, and a FET gate return resistor R3.

In the prior art, the DRO 10 is typically designed for efficiently and optimally producing an RF energy or signal cycling at one specific frequency, or within a very narrow frequency range. For example, the DRO 10 is specifically designed to produce an RF energy or signal cycling at a frequency $f_0$. In order for the DRO 10 to optimally perform, each of the elements of the DRO is tailored designed to optimally operate at such frequency $f_0$. For instance, the dielectric resonator 12 is chosen such that its lowest resonating frequency is slightly below the frequency $f_0$. Similarly, the output and source impedance matching circuits 18 and 20 are designed to provide the optimal impedance matching at frequency $f_0$. Also, the drain and source DC biasing circuits 22 and 24 are designed so that they optimally block an RF energy or signal cycling at the operating frequency of the DRO $f_0$.

To further illustrate the need for optimally designing each of the elements of the DRO 10 for its operating frequency $f_0$, consider for example the drain and source DC biasing circuits 22 and 24. The object of these circuits is to transmit DC power to the FET 14 without affecting the RF energy produced by the DRO 10. To accomplish this objective, the source and drain DC biasing circuits 22 and 24 include respective high impedance transmission lines 26 and 28, each having one end (RF end) connected to an RF-carrying portion of the DRO 10, and another end (DC end) being RF shunted to ground by a bypass capacitor, such as capacitors C1 and C2.

In order for the DC biasing circuits to optimally not affect the RF energy or signal produced by the DRO 10, the length of the high impedance transmission lines 26 and 28 are designed to have a length of a quarter wavelength of an RF energy cycling at the operating frequency of the DRO $f_0$. In addition, the bypass capacitors C1 and C2 are designed to produce an impedance to ground of less than one to two Ohms at the frequency $f_0$. The biasing circuits 22 and 24 typically include resistors R1 and R2 for setting the proper bias voltage for the FET 14. Any deviation of the length of the high impedance transmission lines 26 and 28 from a quarter wavelength length at the operating frequency $f_0$ of the DRO 10 will cause degradation in the performance of the DRO, such as a degradation in the phase noise performance of the device.

From the discussion above, it can be seen that in the prior art DRO 10, the elements of the DRO 10 are tailored designed for optimally operating at the specific operating frequency $f_0$ of the DRO. This presents a problem for manufactures of DROs that need to produce a line of DROs operating at a plurality of different discreet frequencies covering a wide frequency range. In other words, because each type of DROs must be custom designed, it leads to increased engineering time, manufacturing time, cost, inventory and logistics, and a reduction in the reliability of the DROs. Thus, there is a need for a universal DRO design that can be easily modified to optimally operate at a plurality of different discreet frequencies covering a wide frequency range.

Improved FET Gate Return Circuit

Another concern in the design of DROs is the phase noise performance of the device. Reduction in phase noise is desired since high phase noise may affect the performance of systems employing DROs. For instance, DROs often produce an RF carrier that is to be modulated with a baseband signal. If the frequency response of the baseband signal include a relatively low frequency response, its frequency components lie near the RF carrier. If the RF carrier has poor phase noise characteristics, then it will interfere with the modulated baseband signal. Thus, it is desired to reduce phase noise as much as possible in DROs to avoid this interference problem.

Referring again to FIG. 1, one particular element of the prior art DRO 10, namely the FET gate return resistor R3, can cause significant degradation in the phase noise performance of the DRO. The gate return resistor R3 is typically connected in a series feedback or reflective type DRO at the end of the DR-coupling or input resonator transmission line 16. The purpose of the gate return resistor R3 is to provide a path to ground for positive charges that accumulate on the gate of the FET 14 during its operation.

More specifically, during the operation of the DRO 10, a large signal amplitude is generated at the gate input of the FET 14. As the large signal amplitude varies over the positive half of the sinusoid wave, a small amount of positive charges pass through the Schottky diode junction of the gate. These charges interfere with operation of the DRO, and therefore, need to be removed. Thus, the FET gate resistor R3 provides a path to ground to eliminate such unwanted charges. In order to eliminate any unwanted RF reflections off the FET gate resistor R3, this resistor is designed to match the characteristic impedance of the DR-coupling or resonator transmission line 16, which is typically 50 Ohms.

Although the problem of the unwanted positive charges at the input of the DRO 10 is substantially reduced by the FET gate resistor R3, this resistor has an adverse effect of degrading the phase noise performance of the DRO. The reasons for this is that the resistance value of the resistor R3 is relatively low, e.g. 50 Ohms, and it is not properly RF isolated from the DRO circuitry, i.e., it is directly connected to the end of the DR-coupling or resonator transmission line 16. As a result, the resistor affects the RF energy propagating via that DR-coupling or resonator transmission line 16, and consequently, adversely affects the phase noise of the DRO. Accordingly, there is a need to provide a FET gate return resistor that provides a path to ground for the unwanted positive charges emanating from the FET 14, without significantly degrading the phase noise performance of the DRO.

Dielectric Resonator Cavity

Yet another concern in the design of DROs is the temperature stability of the device. Although DROs have superior performance when it comes to phase noise and efficiency, DROs are susceptible to environment temperature changes if they are not properly designed. Therefore, a great deal of engineering time is spent in designing temperature-compensating elements and/or techniques for DROs.

For instance, in FIG. 2, a prior art temperature-compensating DRO circuit 30 is shown. The circuit 30 includes a DRO, such as like the prior art DRO 10 of FIG. 1, coupled to a phase lock loop (PLL) circuit 32. The PLL circuit 32 includes a crystal oscillator 34, a sampling phase detector 36 and a loop filter 38. As it is conventionally known, the crystal oscillator 34 produces a highly temperature-stable sinusoidal signal with typically a much lower frequency $f_x$ than the frequency $f_0$ of the DRO output. This sinusoidal signal is coupled to a first input of the sampling phase detector 36, whereas the output sinusoidal signal of the DRO 10 is coupled to a second input of the sampling phase detector 36 by way of a directional coupler 40. The sampling phase detector 36 produces a phase error signal which is coupled to a frequency-responsive component (not shown), such as a varactor, of the DRO 10 by way of a loop filter 38.

Since the output of the crystal oscillator 34 is highly temperature stable, the output of the DRO 10 is also highly stable since the PLL circuit causes the stability of the DRO output frequency $f_0$ to track the stability of the frequency $f_x$ of the crystal oscillator 34. Hence, with the PLL circuit 32, the DRO 10 is temperature stable, or as good as the temperature stability of the crystal oscillator 34.

However, this temperature stability does not come without a price. For instance, the temperature compensated DRO circuit includes additional components, such as the crystal oscillator 34, sampling phase detector 36, loop filter 38, varactor (not shown) and directional coupler 40. These additional elements add to the costs of the DRO, increases the engineering and manufacturing time, increases inventory, complicates logistics, and reduces the reliability of the DRO circuit. Thus, there is a need for a temperature-compensated DRO that does not require such additional elements. In addition, there is a further need to provide such temperature compensation in a manner that applies to a plurality of operating frequencies so that the DROs need not be custom made.

Temperature-Compensating Resonant Frequency Tuning Device

The reason a DRO or any other dielectric resonator apparatus require temperature compensating circuitry is that the resonant frequency of a dielectric resonator can vary as a function of temperature. In more detail, the resonant frequency of a dielectric resonator is a function of its geometry and size. Typically, standard dielectric resonators available in the market are of cylindrical shape, and are often referred to as dielectric resonator pucks. Therefore, for a dielectric resonator puck, the resonant frequency is dependent on the puck's diameter (Dr) and height (Lr). More accurately, the resonant frequency varies inversely with the puck's diameter (Dr) and height (Lr), i.e. the larger the puck's diameter (Dr) and height (Lr) are, the smaller the resonant frequency is, and vice-versa.

Dielectric resonators are typically comprised of temperature-expanding materials. Accordingly, as the environment temperature changes, the diameter (Dr) and height (Lr) of the dielectric resonator also change with temperature. Generally, as temperature rises, the dielectric resonator material expands, causing its diameter (Dr) and height (Lr) to increase. Conversely, as temperature drops, the dielectric resonator material contracts, causing its diameter (Dr) and height (Lr) to decrease. The resonant frequency of a dielectric resonator, on the other hand, varies inversely with the dielectric resonator size. That is, the larger the resonator's diameter (Dr) and height (Lr) are, the smaller its resonant frequency is, and vice-versa.

It follows then that the resonant frequency of a dielectric resonator varies inversely with temperature variation. That is, as temperature rises, the resonant frequency of the dielectric resonator decreases, and as temperature drops, the resonant frequency increases. Because of the dependent relationship between the resonant frequency of a dielectric resonator and the environment temperature, achieving a desired temperature stability for dielectric resonator devices and/or circuits is not an easy task. As previously discussed, temperature compensating techniques, like the PLL technique discussed above, have been developed but are generally expensive and require sophisticated circuitry.

FIG. 3 shows a cross-sectional view of a prior art, temperature-uncompensated, dielectric resonator apparatus 50 that includes a resonant frequency tuning device 60. The dielectric resonator apparatus 50, which can include filters and dielectric resonator oscillators (DROs), consists of a metallized housing 52 configured to form an enclosed cavity 54. A dielectric resonator puck 56 mounted on a stand-off 58 is situated near the bottom of the housing 52 within the cavity 54. For resonant frequency tuning purposes, a tuning screw 60 is rotatably mounted through the top of the housing 52 and is held in secured place by a hex nut 62.

The tuning device 60 works on the principle that a metal object in proximity to a dielectric resonator affects or alters the resonant frequency of the dielectric resonator. More specifically, as a metal object approaches in proximity to a dielectric resonator, it interacts with the electromagnetic field present around the resonator, causing the resonant frequency to increase. As the metal object is removed, it interacts less with the resonator's electromagnetic fields, causing the resonant frequency to decrease, until it is no longer affected by the metal object.

The tuning device 60 is such a metal object that can be positioned in proximity to the dielectric resonator to control or tune its resonant frequency. Typically, these prior art tuning device are configured into a threaded screw and mounted through the top of the cavity directly above the dielectric resonator 56. By rotating the tuning screw 60, the end of the screw can be positioned near the dielectric resonator to cause its resonant frequency to shift. In this manner, the screw can be positioned in order to obtain the desired resonant frequency for the dielectric resonator 60. Generally, the dielectric resonator is chosen so that its fundamental or unaffected resonant frequency is slightly lower than the desired resonant frequency. The end of the tuning screw 60 is then brought near the resonator to shift its resonant frequency up to the desired frequency.

The dielectric resonator apparatus 50 as shown in FIG. 3 does not include any temperature compensating device and/or circuits for stabilizing the resonant frequency with changes in temperature. Since the tuning screw 60 can alter the resonant frequency of the dielectric resonator, it would be highly desired if such a screw can be configured to counteract the shifts in the resonant frequency due to temperature changes. In other words, it would be highly desirable for a tuning device or screw that can be used not only for setting the desired resonant frequency of the dielectric resonator, but also to provide stability of the resonant frequency during temperature variation.

Puckless RF/Microwave Oscillator

As discussed previously, temperature compensating dielectric resonator devices and/or circuits is not an easy task. It involves substantial engineering time to properly design, manufacturing time to reliably build, and technician time to tune and test. Not only that, it requires substantially more inventory, cost and logistics for the extra components needed to provide the required temperature compensation. In other words, although these dielectric resonator devices and/or circuits achieve superior performance because of the high-Q and low loss properties, temperature compensating these devices make them not as attractive and desirable.

For instance, it would be highly desirable for an RF/Microwave oscillator that could achieve the desired performances of a dielectric resonator oscillator (DRO), such as high-Q, low-loss, and low phase noise attributes, without a dielectric resonator or a resonator that is substantially temperature dependent. Such an oscillator would not need the complicated temperature compensating techniques needed for DROs. If the temperature compensating components were to be eliminated, this would substantially reduce engineering time, manufacturing time and technician time. It would also provide substantial savings in cost because of less components, inventory and logistics. Furthermore, such an oscillator would be more reliable because of its fewer parts. Accordingly, there is a need for an RF/Microwave oscillator that achieves performances comparable to a DRO, without requiring a dielectric resonator.

OBJECTS OF THE INVENTION

The following includes some, but not all, of the objects achieved by the disclosed invention:

It is a general object of the invention to provide a new and improved dielectric resonator oscillator (DRO);

It is an object of the invention to provide a DRO that can be easily modified to optimally operate at a plurality of different discreet frequencies covering a wide frequency range;

It is another general object of the invention to provide a new and improved amplifier;

It is another object of the invention to provide an RF amplifier that can be easily modified to optimally operate at different frequency ranges;

It is another general object of the invention to provide a new and improved DC biasing or grounding circuit for an RF circuit;

It is another object of the invention to provide a DC biasing or grounding circuit that is easily tunable for a plurality of different discreet frequencies;

It is another object of the invention to provide such easily tunable DC biasing or grounding circuit for a DRO;

It is another object of the invention to provide such easily tunable DC biasing or grounding circuit for an RF amplifier;

It is another general object of the invention to provide a cavity or housing for a dielectric resonator (DR);

It is another object of the invention to provide a cavity or housing that provides improved temperature stability for a DR device;

It is another object of the invention to provide a cavity or housing that has improved temperature stability for a DR device capable of operating at a plurality of different discreet frequencies covering a wide frequency range;

It is another object of the invention to provide a cavity or housing for a DRO;

It is another object of the invention to provide a cavity or housing for a dielectric resonator filter;

It is a general object of the invention to provide an improved tuning device for tuning the resonant frequency of a dielectric resonator;

It is an object of the invention to provide a tuning device that can be easily adjusted to provide accurate tuning of the resonant frequency of a dielectric resonator;

It is another object of the invention to provide a tuning device that can substantially temperature stabilize the resonant frequency of a dielectric resonator;

It is also another object of the invention to provide a tuning device that includes multiple settings and/or adjustments so that the desired temperature stability of the resonant frequency of a dielectric resonator can be achieved;

It is another object of the invention to provide a dielectric resonator apparatus that uses the tuning device of the invention;

It is another object of the invention to provide a dielectric resonator oscillator that uses the tuning device of the invention;

It is yet another object of the invention to provide a dielectric resonator filter that uses the tuning device of the invention;

It is another general object of the invention to provide an improved RF/Microwave oscillator;

It is an object of the invention to provide an RF/Microwave oscillator that has the quality factor (Q) performance, low-loss, and phase noise characteristic comparable to a dielectric resonator oscillator; and It is an object of the invention to provide an RF/Microwave oscillator that has the quality factor (Q) performance, low-loss, and phase noise characteristics comparable to a dielectric resonator oscillator, but with improved temperature stability.

SUMMARY OF THE INVENTION

A first aspect of the invention includes a frequency-adjustable direct current (DC) biasing or grounding circuit for any radio frequency (RF) circuit that requires a biasing or grounding circuit, such as a dielectric resonator oscillator (DRO), an RF amplifier, a mixer, a pin attenuator, and a multiplier. The advantage of having a frequency-adjustable (DC) biasing or grounding circuit is that a single design can be used for numerous RF circuits that have different frequency responses. The frequency-adjustable biasing or grounding circuit merely requires minimal tuning so that it can best operate at a desired frequency or frequency range.

The DC biasing or grounding circuit of the invention preferably includes a transmission line for propagating therethrough a direct current or a low frequency signal, and for substantially blocking or isolating an RF energy or signal cycling at a selected frequency or frequency range. The transmission line includes a first portion thereof, preferably an end (referred to herein as an RF end), for connection to an RF circuit. The transmission line includes a second portion thereof, preferably an opposite end (referred to herein as a DC end), for connection to a bias voltage, direct path to ground or a direct path to ground by way of a resistor. The electrical length between the first and second portions of the transmission line is preferably about 90 degrees or about an odd multiple thereof (i.e. 270, 450, 630 . . . Etc. degrees) for an RF energy or signal cycling at a pre-determined frequency, preferably the upper frequency in a prescribed frequency range.

The DC biasing or grounding circuit of the invention includes a low impedance structure to RF ground coupled to the transmission line at about the second portion thereof, or alternatively, the DC end of the transmission line. Because the electrical length between the first and second portions of the transmission line is about 90 degrees or about an odd multiple, the low impedance structure at the second portion (e.g. DC end) translates into a high impedance, or preferably a substantially maximized normalized impedance, at the first portion (e.g. RF end) of the transmission line for an RF energy or signal cycling at the pre-determined higher frequency.

In order to make the DC biasing or grounding circuit of the invention adjustable such that it can present a larger impedance, or preferably a substantially maximized normalized impedance, for RF energies or signals cycling at frequencies other than the pre-determined frequency, the circuit includes a tuning element coupled to the transmission line at about its first portion (e.g. RF end). Preferably, the tuning element is an open ended transmission line that has a length that can be adjusted. By adjusting the length of the open ended transmission line to a particular length, the DC biasing or grounding circuit can present a higher impedance, or preferably a substantially maximized normalized impedance, for an RF energy or signal cycling at a corresponding selected frequency.

Another aspect of the invention is an oscillator, preferably a DRO, that uses the frequency-adjustable DC biasing circuit described above to provide a bias voltage for its active device, such as a field effect transistor, bipolar junction transistor or the like. The frequency-adjustable DC biasing is particularly useful for a line of DROs producing different discrete output frequencies within a specified frequency range. The advantage of the frequency-adjustable DC biasing circuit is that a single design thereof can be incorporated into any of a number of DROs producing different discreet frequency signals.

In the preferred embodiment, the DRO includes an active device, such as a field effect transistor (FET); a dielectric resonator coupled to a port of the active device, such as the gate of the FET; and an adjustable-frequency biasing circuit for biasing the active device, such as the FET. The DRO may include impedance matching circuits as appropriate. With the frequency-adjustable DC biasing circuit, modifying the DRO for a different output frequency is simply done by adjusting the DC biasing circuit so that it provides substantially optimized RF blockage at the specified frequency, providing the proper dielectric resonator puck for the specified frequency, and performing minor tuning on the impedance matching circuits if appropriate to do so. With a versatile DC biasing circuit, a single design can be used on a plurality of different DROs. This leads to reduced costs, manufacturing and engineering efforts, inventory, logistics, and an improvement in the reliability of the DROs.

Another aspect of the invention is an improved technique for providing a gate return for a field effect transistor (FET) used in oscillators that leads to reduced phase noise. The FET gate return of the invention includes a relatively high resistor, for example of about at least 10 kilo Ohms. The resistor is connected to ground and coupled to the DRO by way of a high characteristic impedance transmission line, such that an end or portion thereof is coupled to the FET, preferably near the gate. The high impedance transmission line includes a length of about 90 electrical degrees (quarter wavelength) or about an odd multiple thereof at the operating frequency of the DRO. Preferably, the high characteristic impedance transmission line is connected to the input resonator transmission line if a series-feedback DRO is used. An RF bypass capacitor is preferably connected across the gate return resistor.

Because the FET gate resistor is of relatively high resistance, for example of about at least 10 kilo Ohms, coupled with the fact that it is further RF isolated from the DRO by the quarterwave transmission line, the DRO acquires improved phase noise performance. The FET gate return circuit of the invention can also be made frequency-adjustable, similar to the biasing or grounding circuit discussed above, such that a substantially maximized RF isolation is provided for other different output frequencies of the DRO. This leads to improved phase noise performance for the DRO at the selected frequency.

Yet another aspect of the invention is a cavity or enclosure for a dielectric resonator that provides improved temperature stability over a wide range of frequencies. This cavity would be particularly useful for a line of DROs that output different frequency signals, wherein a single cavity design could be used for all of the DROs and provide the needed temperature stability.

In particular, the dielectric resonator cavity of the invention includes a width or diameter Dc and a height Lc. It is designed to house a dielectric resonator structure, such as a dielectric resonator puck, having a width or diameter of Dr and a height Lr. According to the invention, in order to provide sufficient temperature stability, it is preferred that the diameter Dc of a cylindrical cavity be at least about 3 to about 7.5 times the width or diameter Dr of the enclosed dielectric resonator, and the height Lc of the cavity be at least about 3 to about 7.5 times the height Lr of the enclosed dielectric resonator. For a square cavity, it is preferred that the width Dc be at least about 3 to about $7.5\sqrt{2}$ times the width or diameter Dr of the enclosed resonator, and the height Lc be at least about 3 to about $7.5/\sqrt{2}$ times the height Lr of the enclosed dielectric resonator. Since the resonant frequency of standard dielectric resonator puck linearly correlates with the diameter of the resonator, the cavity provides for improved temperature stability for a frequency range of more than an octave.

Because the dielectric resonator cavity of the invention can accommodate dielectric resonators having resonant frequencies that can differ by more than an octave, a single cavity design can be used on a line of DROs producing outputs that fall within the working frequency range of the cavity. This is of particular advantage since a single cavity design would facilitate manufacturing and engineering efforts, reduce costs, inventory and logistics, and improve the reliability of the DROs. Not only would it be useful for a line of DROs, but it would also be useful for a line of dielectric resonator filters having different frequency responses falling within the working range of the cavity. In addition, the cavity could also be used for other dielectric resonator applications.

In another aspect of the invention, a dielectric resonator tuning device is provided herein that is capable of providing substantial temperature stability to the resonant frequency of a dielectric resonator. Or, in other words, the tuning device has temperature compensation capability for substantially stabilizing the resonant frequency of a dielectric resonator as temperature varies. The temperature compensation feature of the tuning device of the invention works on the principle that as a metal object approaches a dielectric resonator, its resonant frequency tends to increase. Conversely, as a metal object is removed from the proximity of the dielectric resonator, its resonant frequency tends to decrease until it reaches its unaffected or fundamental resonant frequency.

More specifically, the tuning device can be configured such that when temperature increases, a tuning element approaches the dielectric resonator tending to cause its resonant frequency to increase. This action counteracts the tendency of the resonant frequency to decrease as the dielectric resonator expands due to the increasing temperature. Conversely, the tuning device can be configured such that when temperature decreases, a tuning element moves away from the dielectric resonator tending to cause its resonant frequency to decrease. This action counteracts the tendency of the resonant frequency to increase as the dielectric resonator contracts due to the decreasing temperature.

One of the advantages of the tuning device of the invention is that it can be configured to provide a large range of movement with temperature variation. The reason for this is that the tuning device of the invention includes at least three materials that contribute to the movement of the tuning element with temperature variations. The compositions of these materials can be chosen so that the cumulative expansion/contraction of these materials with temperature variation provides the needed movement of the tuning element to obtain the desired temperature stability of the dielectric resonator. Another advantage of the tuning device of the invention is that the individual contributions of the materials to the movement of the tuning element can be easily adjusted to precisely achieve the needed movement of the tuning element to provide the desired temperature stability of the resonant frequency of the dielectric resonator.

In more detail, the dielectric resonator tuning device is preferably comprised of a tuning element, preferably in the form of an elongated cylindrical shaft, which can be solid or hollow. The tuning element includes a portion, preferably an end of the shaft, for electromagnetically interacting with a dielectric resonator. The other end of the shaft is attached to a head portion which includes a slot for receiving a mechanical device, like a screw driver, to assist in the rotation of the tuning element. An inner sleeve is situated coaxially around the tuning element and head portion, and includes an inner set of threads configured to mate with a set of threads formed on the sides of the tuning element and on the side of the head portion. An outer sleeve is situated coaxially around the inner sleeve and includes an inner set of threads configured to mate with an outer set of threads of the inner sleeve. The outer sleeve also includes an outer set of threads for rotational attachment to a dielectric resonator housing or an additional sleeve, if needed.

The linear temperature expansion and contraction of the tuning element, the inner sleeve and the outer sleeve contribute to the overall movement of the tuning element with temperature variations. The desired range of movement of the tuning element can be achieved by proper selection of the materials for the tuning element and inner and outer sleeves. Also, the movement of the tuning element is a function of the length of the tuning element and inner and outer sleeves below their respective point of contact to their adjacent, outer element. These lengths can be changed by rotation of these elements for providing the desired movement of the tuning element.

In another aspect of the invention, an RF/Microwave oscillator is provided herein that is characterized by having high-Q, low-loss, and low phase noise performance, comparable to a dielectric resonator oscillator, with the added benefit of having a resonant circuit that is substantially invariant with changes in temperature. In the preferred embodiment, the RF/Microwave oscillator includes an active device, preferably a field effect transistor or the like, that has three terminals, such as a gate, source and drain, coupled to a tune line or resonator circuit, a feedback circuit preferably of a series type, and an output circuit, respectively. Each of these circuits comprises at least a pair of coupled transmission lines, preferably formed on a substrate in a microstrip form, and is designed to resonate substantially at the operating frequency of the oscillator.

The high-Q, low-loss, and phase noise performance of the RF/Microwave oscillator can be improved by including in the resonator, feedback and output circuits, multiple pairs of coupled transmission lines being cascaded together. The high-Q and low-loss properties of the RF/Microwave oscillator are proportional to the number of cascaded pairs of coupled transmission lines present in the resonator, feedback and output circuits. By including a sufficient amount of cascaded coupled transmission lines in these circuits, the high-Q and low-loss properties of a DRO can be achieved. The advantage of the RF/Microwave oscillator of the invention over a DRO is that its resonant structures are not substantially susceptible to variations in temperature within a given temperature range.

The RF/Microwave oscillator may also include a dc biasing circuit for biasing the active device and preventing RF leakage therethrough. The dc biasing circuit may also be configured to be frequency adjustable as previously discussed. The oscillator may also include a FET gate return circuit for removing unwanted positive charges being passed through the Schottky junction of the FET during its operation. In addition, the RF/Microwave oscillator may also include a frequency tuning circuit that is responsive to an input stimuli, such as a tuning voltage, for controlling the operating frequency of the oscillator.

BRIEF DESCRIPTION OF THE DRAWINGS

The above mentioned objects, other objects and features of the invention and the manner of attaining them will become apparent, and the invention itself will be best understood by reference to the following description of the preferred embodiments of the invention taken in conjunction with the accompanying drawings, wherein.

DETAILED DESCRIPTION OF THE PREFERRED EMBODIMENTS

Dielectric Resonator Oscillator using Frequency-Adjustable Biasing Circuits

Figure 4:
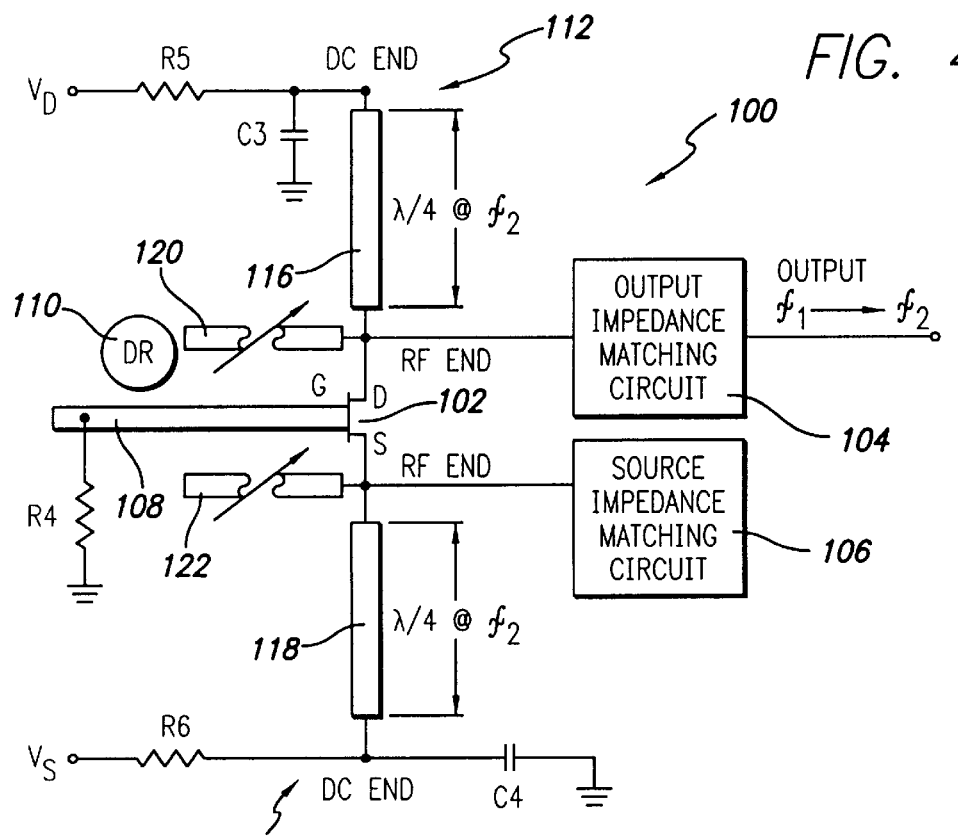
FIG. 4 is a schematic and block diagram of a DRO in accordance with an aspect of the invention.

Referring initially to FIG. 4, a schematic and block diagram of a dielectric resonator oscillator (DRO) 100 as an example of a preferred embodiment of the invention is shown. As shown, the DRO 100 used in this example of the invention is a series feedback or reflective type of DRO. Although this type of DRO is used to exemplify the invention, it shall be understood that other types of DROs may be configured to encompass the invention, including common source, common gate and common drain configurations if a field effect transistor is used as the DRO's active device; series and parallel dielectric coupling types of DROs; and a parallel feedback transistor DRO. Such types of DRO configurations are shown in the book authored by Darko Kajfex et al., entitled "Dielectric Resonators," Artech House 1986, chapter 10.

The DRO 100 preferably includes a metal-semiconductor field effect transistor (MESFET) or a pseudo-morphic high electron mobility transistor (PHEMPT) 102 as the DRO's active device. For the purpose of explaining the invention, the active device will be referred to simply as a field effect transistor or FET 102, and it shall be understood that it includes at least the above mentioned devices. In addition, it shall be understood that other active devices may be employed in place of the preferred MESFET OR PHEMPT, including for example bipolar transistors and heterojunction bipolar transistors.

The DRO 100 further includes output and source impedance matching circuits 104 and 106 coupled to the drain and source of the FET 102, respectively. The DRO 100 also includes an input resonator transmission line 108 including an end coupled to the gate of the FET 102. A dielectric resonator puck (DR) 110 is situated a distance from the gate of the FET 102 and spaced apart from the input resonator line 108, as it is conventionally done. In addition, a shunted FET gate return resistor R4 is preferably coupled to opened end of the input resonator transmission line 108.

As it was previously discussed, there is a need for a DRO design that can be easily modified to optimally perform at a plurality of different discreet frequencies within a specified frequency range. The invention achieves this objective by providing a DRO 100 that it includes adjustable-frequency direct current (DC) biasing circuits, such as drain and source DC biasing circuits 112 and 114. More specifically, the DC biasing circuits can be easily modified to optimally or substantially block an RF energy or signal cycling at a frequency that comes within a tunable range of the biasing circuits. By tuning the adjustable-frequency DC biasing circuits 112 and 114, the DRO 100 can be easily modified to optimally generate an RF energy or signal cycling at the specified frequency within a tunable range of the DC biasing circuits.

The DC biasing circuits 112 and 114 include respective transmission lines 116 and 118, each preferably having an electrical length of about 90 degrees or about an odd multiple thereof (such as 270, 450, 630 ... etc. degrees) for an RF energy or signal cycling at a frequency preferably at the upper end of the frequency range for the DRO 100. In other words, if the DRO 100 can be easily modified to produce outputs having discreet frequencies within a frequency range from $f_1$ to $f_2$, then it is preferred that the transmission lines 116 and 118 have an electrical length of about 90 degrees or about an odd multiple thereof for an RF energy cycling at the upper end of the frequency range, i.e.

$f_2$. In addition, the transmission lines 116 and 118 preferably include a high characteristic impedance of, for example, at least about 80 Ohms.

The transmission lines 116 and 118 of the DC biasing circuits 112 and 114 each include a first end (RF end) for attachment or electrical connection with an RF-carrying portion of the DRO 100, preferably near the drain and source of the FET 102, respectively. The DC biasing circuits 112 and 114 further include RF bypass capacitors C3 and C4 electrically connected to opposite ends (DC ends) of the transmission lines 116 and 118. In the preferred embodiment, the capacitance of capacitors C3 and C4 should preferably provide a low impedance to ground for an RF energy cycling at the lower end of the workable frequency range, i.e. frequency $f_1$. In the preferred embodiment, the capacitors C3 and C4 are chosen to provide a low impedance having an imaginary component of about one ohm or less at the lower end frequency $f_1$. The DC biasing circuits 112 and 114 may also include current-limiting resistors R5 and R6, which may be variable for properly setting the bias voltages for the FET 102.

The DC biasing circuits 112 and 114 become frequency-adjustable by the inclusion of a tuning element, such as tunable transmission lines or stubs 120 and 122. These transmission lines 120 and 122 are tunable because their electrical lengths or physical lengths can be adjusted. The tunable transmission lines 120 and 122 include respective first ends attached to about the RF ends of corresponding transmission lines 116 and 118 of the DC biasing circuits 112 and 114, respectively. The other ends of the tunable transmission lines 120 and 122 are preferably opened ends.

In operation, if the electrical length or physical length of the tunable transmission lines 120 and 122 is 0 degrees (as if there existed no tunable transmission lines), the normalized impedance at the RF ends of the transmission lines 116 and 118 are maximized or substantially maximized for an RF energy cycling at the upper end frequency $f_2$. This is because without the tunable transmission lines 120 and 122, the DC biasing circuits 112 and 114 look like the typical quarter wavelength biasing lines that are commonly employed in the prior art.

Since transmission lines 116 and 118 can be designed to have a plurality of characteristic impedances, the normalized impedance parameter is used because it is independent of the characteristic impedance of the transmission lines, and can be defined as the actual impedance Z divided by the characteristic impedance of the line $Z_0$, i.e. $Z/Z_0$. Alternatively, the maximum normalized impedance can also be defined as an impedance where the phase of an incident RF energy is substantially equal and opposite with the phase of a reflected RF energy at the region presenting maximum normalized impedance. Such regions in the DRO 100 of the invention are the RF ends of the transmission lines 116 and 118, or the regions where these lines attach to the RF-carrying portion of the DRO 100.

If the electrical lengths of the tunable transmission lines 120 and 122 are increased from 0 degrees to above 0 degrees, the maximum normalized impedance at the RF ends of the transmission lines 116 and 118 shift for RF energies or signals having frequencies lower than the upper end frequency $f_2$. Thus, by increasing or varying the electrical or physical lengths of the tunable transmission lines 120 and 122, the DC biasing circuits 112 and 114 can be tuned to increase the impedance, preferably to a substantially maximized normalized impedance, at the RF ends for an RF energy or signal having a discreet frequency within the working range of the DRO 100, i.e. frequency range $f_1$ to $f_2$.

It is desired for a DRO to have DC biasing circuits that minimizes the effects they have on the RF energy or signal being produced by the DRO. In order to do this, the DC biasing circuits preferably need to be designed to present to the RF circuit or DRO, a substantially maximized normalized impedance. In this manner, RF energy in the DRO cannot escape through or adversely reflect from the DC biasing circuits. For DROs, any adverse effects from the DC biasing circuits generally increases the phase noise of the RF energy or signal produced by the DRO. Therefore, for performance purposes, the DC biasing circuits 112 and 114 should be tuned so that a substantially maximized normalized impedance is present at the RF ends of the transmission lines 116 and 118 for the desired discreet output frequency. Thus, with the use of the adjustable-frequency DC biasing circuits 112 and 114, DRO 100 can be easily modified to optimally perform at a plurality of discreet frequencies.

An advantage of the frequency-adjustable DC biasing circuits 112 and 114 is that it allows a single DRO design to cover a plurality of discreet frequencies within the working frequency range. As a result, DRO manufacturers need not custom design the DROs for a particular output frequency. This provides for substantial savings in cost, engineering and manufacturing time, a reduction in inventory and logistics, and also improves the reliability of the DROs.

RF Amplifier and Other RF Devices using Frequency-Adjustable Biasing Circuits

Figure 5:
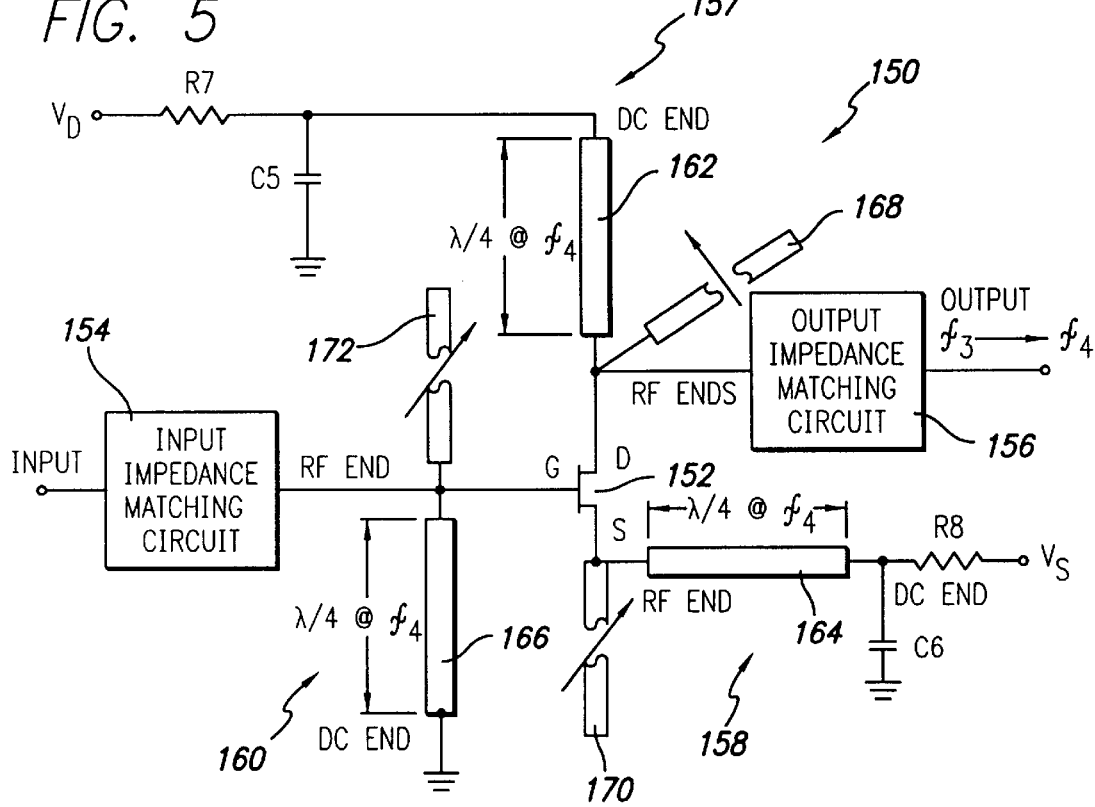
FIG. 5 is a schematic and block diagram of an RF amplifier in accordance with another aspect of the invention.

Although it has been shown that the frequency-adjustable DC biasing circuits 112 and 114 are substantially beneficial to DROs, it shall be understood that these biasing circuits can be employed in other RF circuits where DC biasing is required. For instance, in FIG. 5, an RF amplifier 150 is shown that includes a plurality of frequency-adjustable DC biasing circuits. As it is conventionally known, the RF amplifier 150 preferably includes a MESFET or PHEMPT 152, or can include in place thereof other suitable active devices such as a BJT or a hetero-junction BJT. The RF amplifier 150 also includes input and output impedance matching circuits 154 and 156, as it is conventionally employed.

The RF amplifier 150 also includes frequency-adjustable drain and source DC biasing circuits 157 and 158 and a frequency-adjustable gate DC grounding circuit 160. As previously discussed, the biasing and grounding circuits 157, 158 and 160 include respective transmission lines 162, 164 and 166, each having an electrical length of about 90 degrees or about an odd multiple thereof at preferably the upper end frequency $f_4$ of the operating frequency range $f_3$ to f4 of the amplifier. The transmission lines 162, 164 and 166 include ends (RF ends) for electrically connecting to the source, drain and gate of the FET 152.

The adjustable-frequency biasing and grounding circuits 157, 158 and 160 also include tunable transmission lines or stubs 168, 170 and 172 coupled to about the RF ends of the transmission lines 162, 164 and 166. RF bypass capacitors C5 and C6 and current-limiting resistors R7 and R8 are coupled to about the DC ends of transmission lines 162 and 164. A direct path to ground is connected at the DC end of transmission line 166 of the grounding circuit 160. By adjusting the lengths of the tunable transmission lines 168, 170 and 172, the biasing circuits 157, 158 and 160 can be tuned for any specified frequency within the frequency range $f_3$–$f_4$, such as the center frequency.

Other RF devices or circuits that may benefit from such frequency-adjustable biasing or grounding circuits include, for example, mixers, pin attenuators, frequency multipliers or generally any other RF device that requires a biasing or grounding circuit where optimum RF isolation at a particular frequency is desired.

Preferred Layout of the Frequency-Adjustable Biasing and Grounding Circuits

Figure 6:
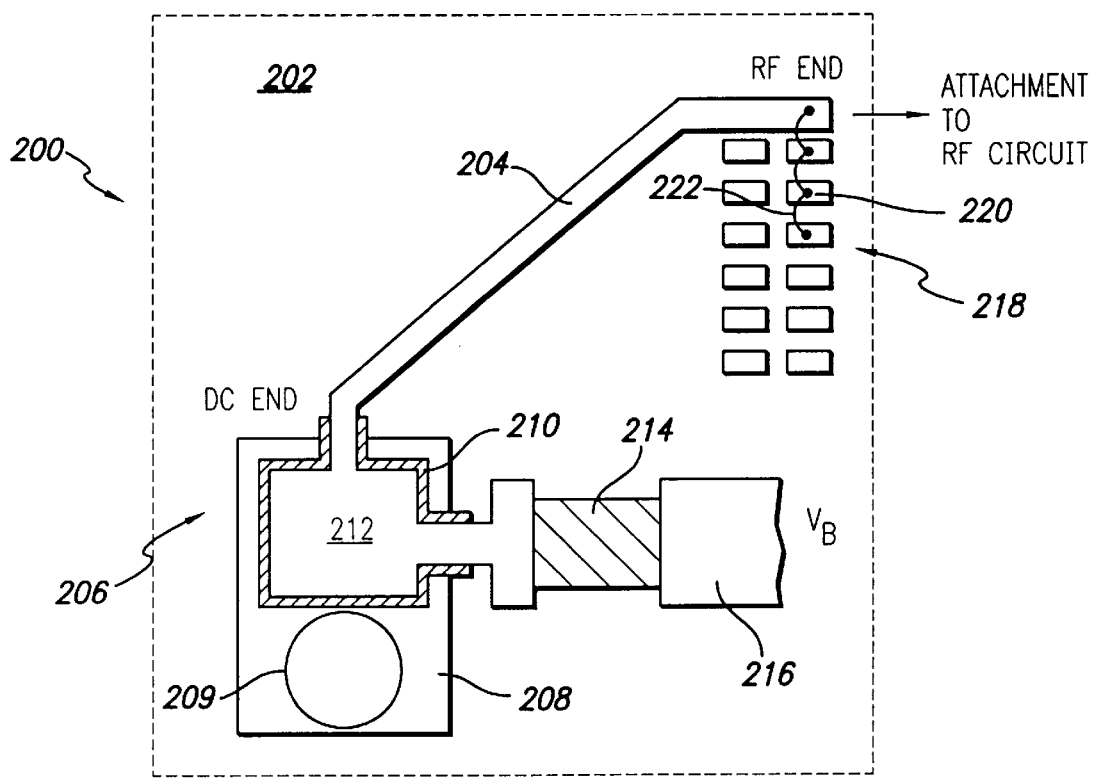
FIG. 6 is a layout of a direct current (DC) biasing circuit for an RF circuit in accordance with yet another aspect of the invention.

Referring to FIG. 6, a preferred configuration for a frequency-adjustable DC biasing circuit 200 is shown. The DC biasing circuit 200 is preferably formed on a substrate 202, preferably of alumina material having a preferred height between about 5 to 25 mils, and preferably in a microstrip configuration. The DC biasing circuit 200 includes an RF isolating transmission line 204 having an electrical length that extends from an RF end to a DC end of about 90 degrees or about an odd multiple thereof for an RF energy or signal cycling at a pre-determined higher frequency. In the preferred embodiment, the DC biasing transmission line 204 has a characteristic impedance of at least about 80 Ohms, and has a width of about 1 to 2 mils. Also in the preferred embodiment, the transmission line 204 is formed of two layers of thin films comprised of a lower layer of titanium-tungsten material and an upper layer of gold material. It shall be understood that the transmission line 204 can be formed of other suitable electrically-conductive materials or even of thick film materials.

The DC biasing circuit 200 also preferably includes a thin-film RF-bypass capacitor 206 comprised of a lower metal layer pad 208 including a metallized via hole 209 through the substrate 202 for electrically connecting to a grounded metal layer (not shown) formed on the underside of the substrate. The capacitor 206 also includes an insulating or dielectric layer 210 formed on the metallized pad 208 and may be comprised of silicon-nitride, silicon-dioxide material, or other suitable dielectric materials. The capacitor 206 further includes a top metallization layer 212 being electrically connected to the DC end of transmission line 204 and also to a biasing or current-limiting thin film resistor 214. Preferably, the resistor 214 is formed of tantalum-nitride or nickel chromium, but other suitable materials can be used in place thereof. The thin-film resistor 214 is also connected to a conductive line 216 for receiving a bias voltage $V_B$.

The DC biasing circuit 200 also includes at about the RF end of the transmission line 204, an adjustable-length, open ended transmission line 218 preferably comprised of a plurality of metallized pads 220 arranged along a line or in an array, and preferably electrically connected in series by a wire bond or ribbon 222 to form the required length of the open ended transmission line 218. The length of the open ended transmission line 218 can be adjusted by adding or deleting metallized pads to the series of pads electrically connected to each other by the wire or ribbon bond 222. As it is well known in the art, such wire or ribbon bond are typically welded on such metallized pads 220.

Figure 7:
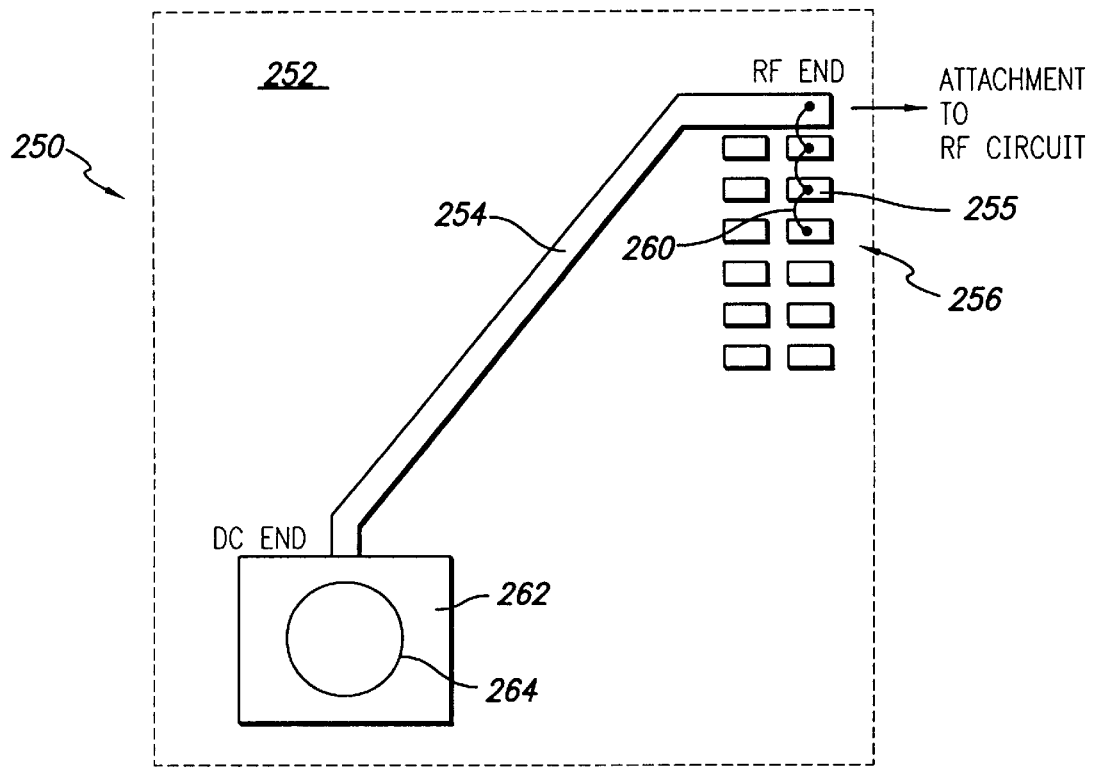
FIG. 7 is a layout of a DC grounding circuit for an RF circuit in accordance with another aspect of the invention.

Referring to FIG. 7, a preferred configuration for a frequency-adjustable grounding circuit 250 is shown. The grounding circuit 250 is similar to that of DC biasing circuit 200 described in FIG. 6, in that it includes a metallized transmission line 254 preferably formed on an alumina substrate 252 in a microstrip configuration, and having an electrical length of 90 degrees or an odd multiple thereof that extends from an RF end to a DC end. The grounding circuit 250 similarly includes an open ended transmission line 256 preferably comprised of a plurality of metallized pads 258, arranged in a line or in an array, and electrically connected in series by wire bond or ribbon 260. The length of the open ended transmission line 256 can be adjusted by adding or deleting metallized pads to the series of pads electrically connected by the wire or ribbon bond 258 for tuning the grounding circuit for better performance at other RF frequencies.

The grounding circuit 250 differs from the biasing circuit 200 in that a direct path to ground is connected to the DC end of the transmission line 254, rather than an RF bypass capacitor. Both structures, however, provide a low impedance to ground. In the preferred embodiment, the direct path to ground comprises a metallized pad 262 connected to about the DC end of the transmission line 254. The metallized pad 262 is grounded by way of a metallized via hole 264 electrically connected to a grounded metallized layer (not shown) on the underside of the substrate 252.

Improved FET Gate Return

Figure 8:
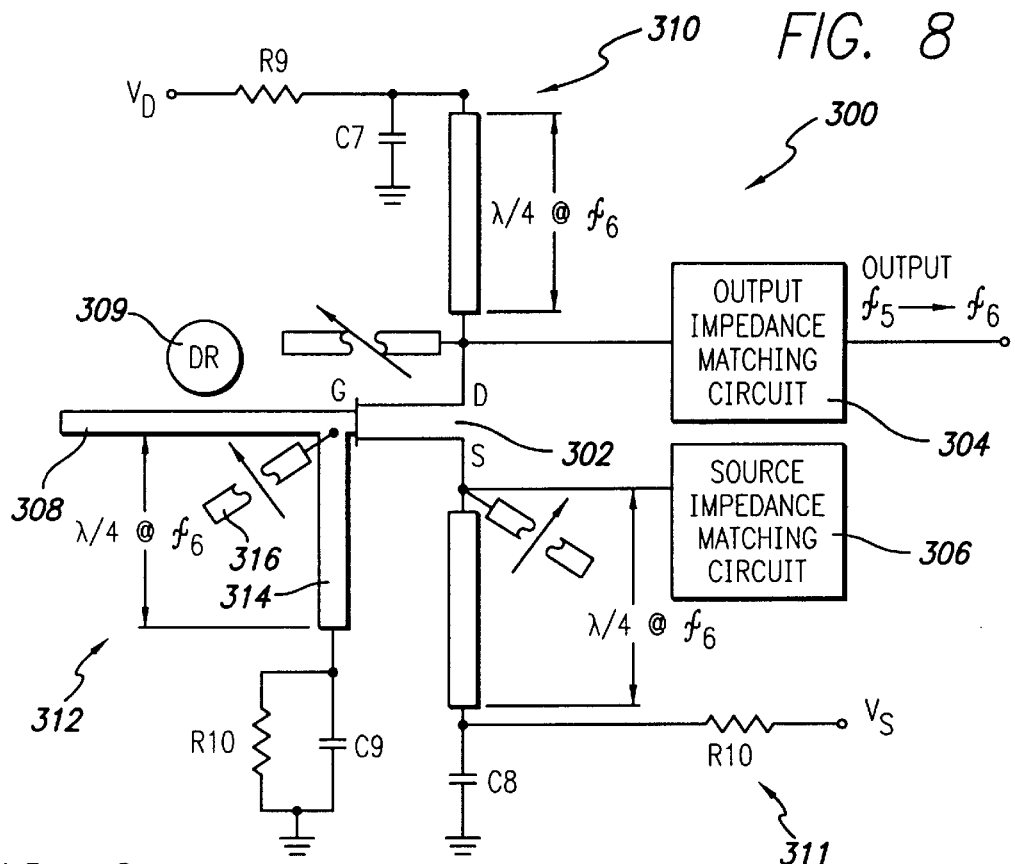
FIG. 8 is a schematic and block diagram of another DRO in accordance with another aspect of the invention.

Referring now to FIG. 8, a schematic and block diagram of an oscillator, preferably a DRO 300, as an example of another aspect of the invention is shown. This DRO 300 is directed at improving the FET gate return of the prior art to better reduce the phase noise of the DRO. The DRO 300 improves the phase noise performance of the device by eliminating the low resistance FET gate return typically employed in the prior art, and preferably including a much higher resistance FET gate return. The DRO 300 better RF isolates the FET gate resistor by employing a high-Q quarterwave transmission line circuit. The much higher resistance coupled with the RF isolating circuit reduces the effects the FET gate return has on the RF energy or signal of the DRO, thereby reducing the phase noise of the device.

The example DRO 300 of the invention preferably includes a MESFET or PHEMPT 302 as its active device, output and source impedance matching circuits 304 and 306 coupled to the drain and source of the FET 302 respectively, an input resonator transmission line 308 coupled to the gate of the FET 302, a dielectric resonator puck 309 spaced apart from and electromagnetically coupled to the input resonator transmission line 308, and source and drain bias circuits 310 and 311, which could be frequency-adjustable as previously described or fixed-frequency as in the prior art biasing circuits.

The improved phase noise performance of the DRO 300 of the invention comes about by an improved FET gate return circuit 312. The FET gate return circuit 312 comprises a transmission line 314 having an end (RF end) coupled to the input resonator transmission line 308 preferably near the gate of the FET 302. The transmission line 314 is preferably of high characteristic impedance, for example, of at least about 80 Ohms and includes an electrical length of about 90 degrees (quarter wavelength) or about an odd multiple thereof (such as 270, 450, 630 . . . etc. degrees) for the operating RF frequency of the DRO 300.

At the opposite end (DC end) of the transmission line 314 is connected an RF bypass capacitor C9 and a gate return resistor R10. The bypass capacitor C9 provides a low impedance to ground at about the DC end of the transmission line 314 for an RF energy cycling at the operating frequency of the DRO 300. In the preferred embodiment, the impedance of the bypass capacitor C9 at the operating frequency of the DRO 300 is preferably less than about one to two Ohms. The gate return resistor R10 preferably includes a resistance of at least about 10 kilo Ohms. Such high value resistance coupled with the RF isolating properties of the quarterwave transmission line 314, provides for minimal effects the gate return resistance has on the RF energy or signal of the DRO 300. This leads to improved phase noise characteristics of the DRO 300.

The improved FET gate return 312 can also be made to be frequency-adjustable, similar to the adjustable biasing or grounding circuits previously discussed. In this regard, the transmission line 314 preferably includes an electrical length of about 90 degrees (quarter wavelength) or about an odd multiple thereof at the highest operating RF frequency of the DRO 300, i.e. $f_6$. In addition, the bypass capacitor C9 preferably includes an impedance of less than about one to two Ohms for an RF energy cycling at the lower end of the frequency range, i.e. $f_5$. In order to optimize the RF isolating properties of the transmission line 314 for other discreet frequencies, an adjustable-length, preferably open-ended, transmission line 316 is coupled to the transmission line 314 at about its RF end. As previously discussed, by adjusting the length of the transmission line 316, the RF isolation at the RF end of the FET gate return 312 can be optimized for other discreet frequencies within the working frequency range $f_5$ to $f_6$.

Figure 9:
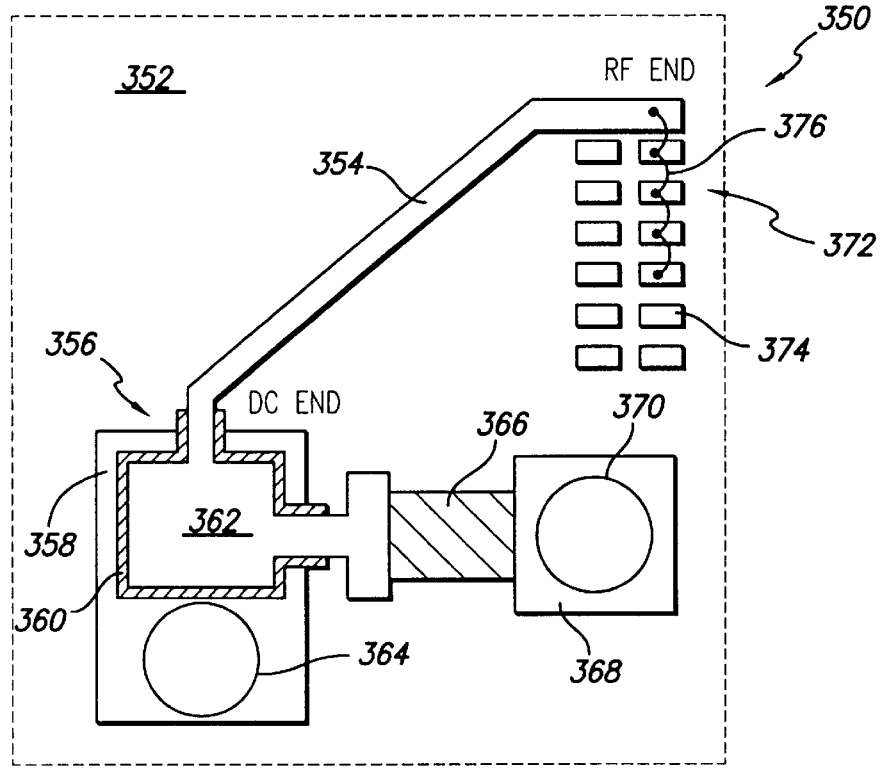
FIG. 9 is a layout of a field effect transistor (FET) gate return circuit in accordance with another aspect of the invention.

Referring to FIG. 9, a preferred configuration for a frequency-adjustable FET gate return circuit 350 is shown. The FET gate return 350 is formed on a substrate 352, preferably of an alumina material having a height of about 5 to 25 mils, and in a microstrip configuration. The FET gate return 350 includes a transmission line 354 having an electrical length from an RF end to a DC end of the line of about 90 degrees or about an odd multiple thereof, preferably at the upper frequency of the working frequency range of the DRO. The transmission line 354 preferably includes a high characteristic impedance of at least about 80 Ohms, and therefore has a width of about 1 to 2 mils. The transmission line 354 is preferably formed of suitable conducting thin-film material, such as titanium-tungsten-gold or chromium-copper-gold.

The FET gate return 350 further includes an RF bypass capacitor 356 coupled to the DC end of the transmission line 354. The capacitor comprises a lower metallization layer pad 358 formed on the substrate 352, insulating layer 360, preferably of silicon nitride or silicon dioxide material, formed on the lower metallization layer pad, and an upper metallization layer 362 formed on the insulating layer. The lower metallization layer pad 358 is connected to ground preferably by way of a metallized via hole 364 formed through the substrate 352 and electrically connected to a metallization layer (not shown) formed on the underside of the substrate. The upper metallization layer 362 of the capacitor 356 is connected to the DC end of the transmission line 354.

The FET gate return 350 further includes a gate return resistor 366 electrically coupled to the capacitor 356 by way of the upper metallization layer 362. The resistor 366 preferably includes a resistance of about at least 10 kilo Ohms and is preferably formed of suitable thin-film material, such as tantalum-nitride or nickel chromium. The resistor 366 is electrically connected to ground by way of metallization pad 368 including a metallized via hole 370 through the substrate 352. The metallized via hole 370 is electrically connected to a grounded metallization layer (not shown) formed on the underside of the substrate 352.

In order for the FET gate return 350 to provide optimized RF isolation for RF frequencies within the working frequency range, an adjustable-length, preferably open-ended transmission line 372 is coupled to the transmission line 354 at about its RF end. The adjustable-length transmission line 372 is preferably formed of a plurality of metallized pads 374 formed in a line or in an array configuration, which are electrically connected to each other by wire bond or ribbon 376. The length of the transmission line 372 can be adjusted by adding or removing metallized pads 374 from the connection formed by the wire bond or ribbon 376.

Multiple-Frequency Dielectric Resonator Cavity

As previously discussed, it is desired that a DRO be designed such that it can be easily modified to optimally perform at a plurality of discreet frequencies covering a wide frequency range, preferably by replacing the appropriate dielectric resonator puck and performing minimal or minor tuning on the DRO circuit. If this can be done, a DRO design need not be customized for different output frequencies. This would reduce engineering and manufacturing time, inventory, the complexity in logistics, and increases the reliability of the DRO circuit.

Not only is it desirable that the DRO be designed so that it is capable of operating over a wide frequency range with minimal modification, it is also desirable that the DRO be temperature stable over such wide frequency range. A dielectric resonator is affected by changes in the environment temperature in at least a couple of manners. First, changes in temperature causes the dielectric resonator to either expand or contract. Such expansion and contraction of a dielectric resonator decreases and increases its resonant frequency, respectively. Second, the resonant frequency of a dielectric resonator also changes as a metal object is brought near the dielectric resonator. Specifically, as a metal object is brought near the dielectric resonator, the resonant frequency of the dielectric resonator typically increases. If it is gradually removed from near the dielectric resonator, the resonant frequency typically decreases until it is no longer affected by the metal object.

A metal cavity or enclosure that houses a dielectric resonator acts similar to a metal object in proximity of a dielectric resonator, i.e. it affects the resonant frequency of the dielectric resonator depending on the distance between the cavity and the dielectric resonator. As environment temperature changes occur, the dielectric resonator cavity or enclosure either expands or contracts. This expansion or contraction of the cavity affects the resonant frequency of the dielectric resonator. Consequently, the resonant frequency of the DRO output is similarly affected.

In order to improve the temperature stability of a DRO design and also provide a design that is capable of operating over a wide frequency range with minimal modifications required, the inventor has conceived an optimum sizing for a dielectric resonator cavity or enclosure. This discovered sizing for the dielectric cavity would not only provide better temperature stability for the DRO, but would achieve such improved temperature stability for a plurality of dielectric resonators having resonant frequencies covering a wide frequency range.

Figure 10A:
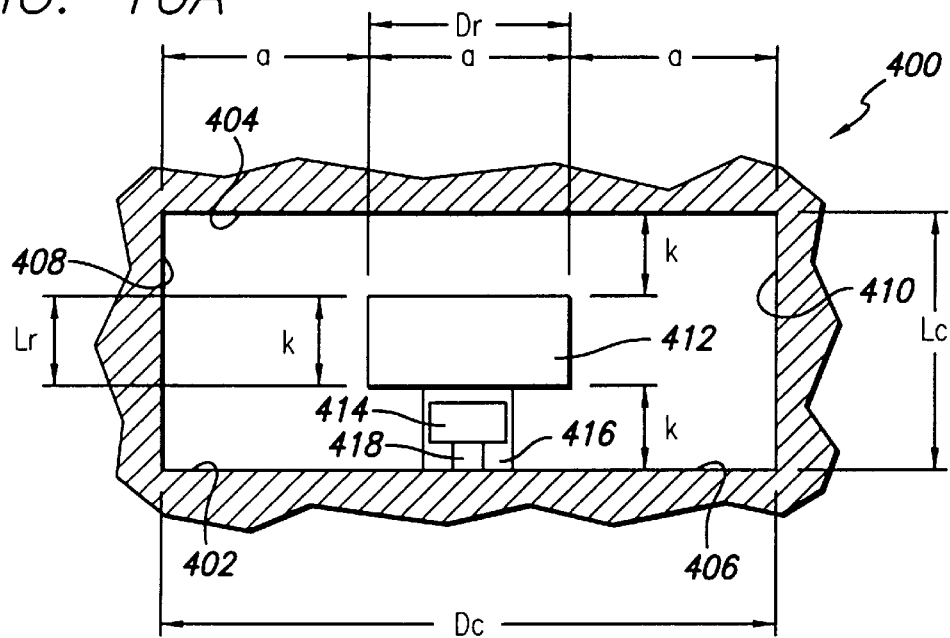
FIGS. 10A and 10B are side and bottom cross-sectional views of a cavity design for a dielectric resonator in accordance with another aspect of the invention.
Figure 10B:
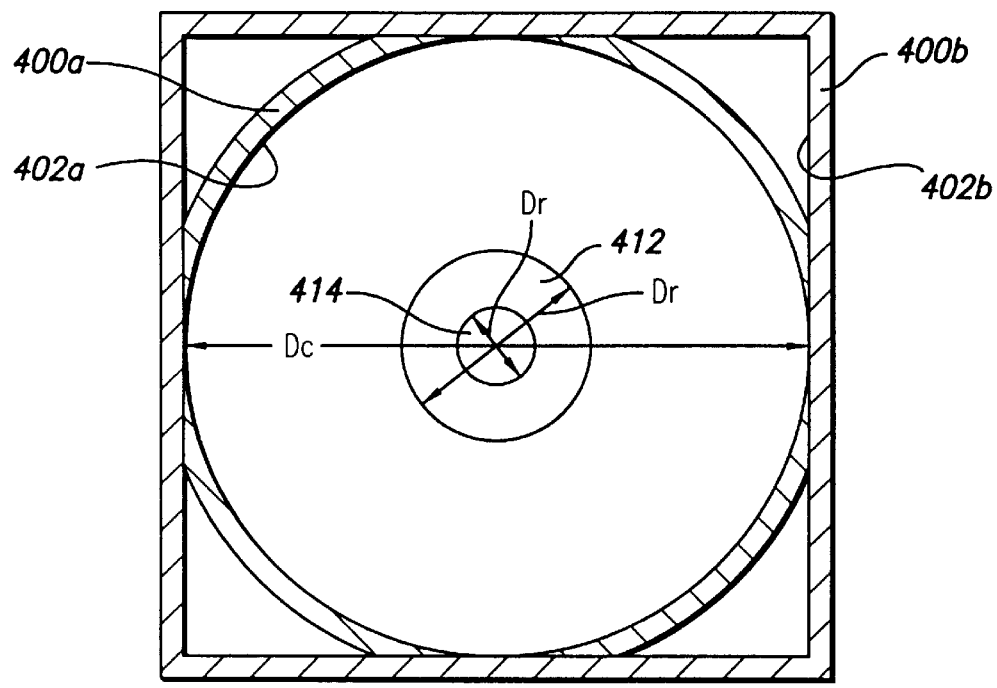

Referring to FIGS. 10A and 10B, side and top cross-sectional views of a dielectric resonator cavity or enclosure 400 are shown. In the example cavity of the invention, a cylindrical shaped cavity 400a and a square shaped cavity 400b (preferably square) are used to illustrate the optimum sizing of the cavity. Reference number 400 is used to refer to the cavity generally, without regard to its specific shape. The letters "a" and "b" in connection with a reference number are used to refer to the cylindrical and square cavities, respectively. Although the cylindrical and square cavities are used to exemplify the invention, it shall be understood that the optimum sizing of the cavity can be applied to other shapes, as explained later.

In detail, the cavity 400 includes an inner surface 402 that is preferably in a cylindrical 402a or square 402b configuration including a top or ceiling 404, a bottom or floor 406, and a side wall (cylindrical) or walls (square) 408 and 410. The diameter or width of the inner surface 402 of the cavity 400, i.e. the width or diameter of the top 404 and bottom 406, can be represented as Dc. Whereas the height of the inner surface 402 of the cavity 400, i.e. the height of the side wall(s) 408 and 410, can be represented as Lc.

The dielectric resonator cavity 400 houses or encloses a dielectric resonator structure, preferably of a puck or cylindrical shape. A pair of dielectric resonator pucks 412 and 414 along with corresponding stand-offs 416 and 418 are shown in FIGS. 10A and 10B (FIG. 10B does not show the stand-offs for the sake of clarity). The dielectric resonator pucks 412 and 414 represent the preferred extremes of the range of dielectric resonator size that can be enclosed by the cavity 400 and achieve optimum temperature stability. The width or diameter of a dielectric resonator puck that can be housed by the cavity 400 in accordance with the invention can be represented as Dr. Whereas the height of such dielectric resonator puck can be represented as Lr.

The inventor has discovered that in order for the cylindrical cavity 400a to provide improved temperature stability for an enclosed dielectric resonator, it is preferred that the diameter Dc of the inner surface 402a of the cavity 400a, i.e. the width or diameter of the top 404 and bottom 406, be within a range of about 3 times to about 7.5 times the diameter or width Dr of the enclosed dielectric resonator. In addition, it is preferred that the height Lc of the inner surface 402a of the cavity 400a, i.e. the height of the side wall 408, be within a range of about 3 times to about 7.5 times the height Lr of the enclosed dielectric resonator.

For the square cavity 400b to provide improved temperature stability for an enclosed dielectric resonator, it is preferred that the width Dc of the inner surface 402b of the cavity 400b, i.e. the width of the top 404 and bottom 406, be within a range of about 3 times to about $7.5/\sqrt{2}$ times the diameter or width Dr of the enclosed dielectric resonator. In addition, it is preferred that the height Lc of the inner surface 402b of the cavity 400b, i.e. the height of the side walls 408 and 410, be within a range of about 3 times to about $7.5/\sqrt{2}$ times the height Lr of the enclosed dielectric resonator.

In other words, the following preferred relationships hold:

| Cylindrical Cavity | Square Cavity | |
|---|---|---|
| $7.5 * Dr \geq Dc \geq 3 * Dr$ | $7.5/\sqrt{2} * Dr \geq Dc \geq 3 * Dr$ | Eq. 1 |
| $7.5 * Lr \geq Lc \geq 3 * Lr$ | $7.5/\sqrt{2} * Lr \geq Lc \geq 3 * Lr$ | Eq. 2 |

In the example shown in FIGS. 10A and 10B, dielectric resonator puck 412 represents the largest dielectric resonator puck that can be preferably enclosed by cavity 400 and exhibit improved temperature stability. That is, the diameter Dc and height Lc of the inner surface 402 of the cavity 400 is about 3 (cylindrical and square) times larger than diameter Dr and height Lr of the dielectric resonator puck 412. With respect to the largest dielectric resonator puck 412, it is preferred that the height of the stand-off 416 is such that the puck 412 is situated near the center of the cavity 400. This would result in the distances between top 404 and the puck, and the bottom 406 and the puck to be approximately equal distances, i.e. k.

The dielectric resonator puck 414 represents the smallest dielectric resonator puck that can be preferably enclosed by cavity 400 and exhibit improved temperature stability. That is, the diameter Dc and height Lc of the inner surface 402 of the cavity 400 is about 7.5 (cylindrical) or $7.5/\sqrt{2}$ (square) times larger than the diameter Dr and height Lr of the dielectric resonator puck 414.

Thus, the preferred frequency range for cavity 400 is determined by about the resonant frequency of the preferred largest dielectric resonator puck 412 and the preferred smallest dielectric resonator puck 414. The resonant frequency for a cylindrical dielectric resonator (puck) may be approximated by the following equation:

$$f_{RES} = K_{CORR}/[K_P^{1/2} * (\pi/4)^{1/3} * (Dr^2 * Lr^{1/3}] \quad \text{Eq.3}$$

where $f_{RES}$ is the resonant frequency of the puck, $K_{CORR}$ is a constant correction factor, and $K_P$ is the dielectric constant of the puck material. Most cylindrical dielectric resonators are designed such that their height Lr fall within the following range relative to their diameters Dr:

$$0.35 * Dr < Lr < 0.45 * Dr \quad \text{Eq.4}$$

Assuming that the height of a dielectric resonator puck is about 0.40 times its diameter Dr, equation 3 reduces to the following relationship:

$$f_{RES} = K_{CORR}/[K_P^{1/2} * (\pi/4)^{1/3} * (0.4)^{1/2} * Dr] \quad \text{Eq.5}$$

Equation 5 illustrates that there exists a linear, but inverse, relationship between the diameter Dr of the dielectric resonator puck and its resonant frequency $f_{RES}$. Assuming that the largest and smallest dielectric resonator pucks 412 and 414 have the same dielectric constant, then the working frequency range $f_7$ to $f_8$ of the cavity 400 can be approximated by the following relationship:

$$f_8/f_7 = f_{RES}(\text{small puck})/f_{RES}(\text{large puck}) = \quad \text{Eq.6}$$

Dr (large puck)/Dr(small puck)

Substituting the preferred ranges for the diameter Dr of enclosed dielectric resonator pucks given by equation 1, the following relationship approximates the working frequency range for the cavity 400:

| Cylindrical Cavity | Square Cavity | |
|---|---|---|
| $f_8/f_7 = 7.5/3 = 2.5$ | $f_8/f_7 = 7.5/3\sqrt{2} = 1.77$ | Eq. 7 |

Hence, according to equation 7, it can be seen that the working frequency range for the cylindrical cavity 400a is well over an octave, and for the square cavity is about three-quarters of an octave. As a result, a plurality of DROs having different respective discreet output frequencies covering a wide frequency range can be designed with the use of a single cavity 400. This is of considerable advantage with respect to engineering and manufacturing time, cost, inventory, logistics and reliability.

Although the preferred dimensions for the cavity 400 is provided by equations 1 and 2, it shall be understood that other preferred ranges may include any subset within the preferred range. For instance, the following Tables 1 and 2 provide examples of other preferred ranges within those given by equations 1 and 2 for the cylindrical and square cavities, respectively:

TABLE 1

Cylindrical Cavity

| Dc (Approximate Lower Value) | Dc (Approximate Upper Value) | Lc (Approximate Lower Value) | Lc (Approximate Upper Value) |
| --- | --- | --- | --- |
| 4.5 * Dr | 7.5 * Dr | 4.5 * Lr | 7.5 * Lr |
| 5.0 * Dr | 7.5 * Dr | 5.0 * Lr | 7.5 * Lr |
| 5.5 * Dr | 7.5 * Dr | 5.5 * Lr | 7.5 * Lr |
| 6.0 * Dr | 7.5 * Dr | 6.0 * Lr | 7.5 * Lr |
| 5.0 * Dr | 7.0 * Dr | 5.0 * Lr | 7.0 * Lr |
| 5.0 * Dr | 6.5 * Dr | 5.0 * Lr | 6.5 * Lr |

TABLE 2

Square Cavity

| Dc (Approximate Lower Value) | Dc (Approximate Upper Value) | Lc (Approximate Lower Value) | Lc (Approximate Upper Value) |
| --- | --- | --- | --- |
| 3.50 * Dr | 5.30 * Dr | 3.50 * Lr | 5.30 * Lr |
| 4.00 * Dr | 5.30 * Dr | 4.00 * Lr | 5.30 * Lr |
| 4.50 * Dr | 5.30 * Dr | 4.50 * Lr | 5.30 * Lr |
| 5.00 * Dr | 5.30 * Dr | 5.00 * Lr | 5.30 * Lr |
| 4.00 * Dr | 4.80 * Dr | 4.00 * Lr | 4.80 * Lr |
| 4.00 * Dr | 4.30 * Dr | 4.00 * Lr | 4.30 * Lr |

As previously mentioned, the optimum sizing for the dielectric resonator cavity can be applied to other shapes. As a general rule, the distance from the center of the shape (where the dielectric resonator lies) to the most outer edges of its inner surface should not exceed the corresponding distance of the upper boundary for the cylindrical cavity, i.e. 7.5/2*Dr. Also, that same distance should not be less than the corresponding distance of the lower boundary for the cylindrical cases, i.e. 3/2*Dr.

Figure 11:
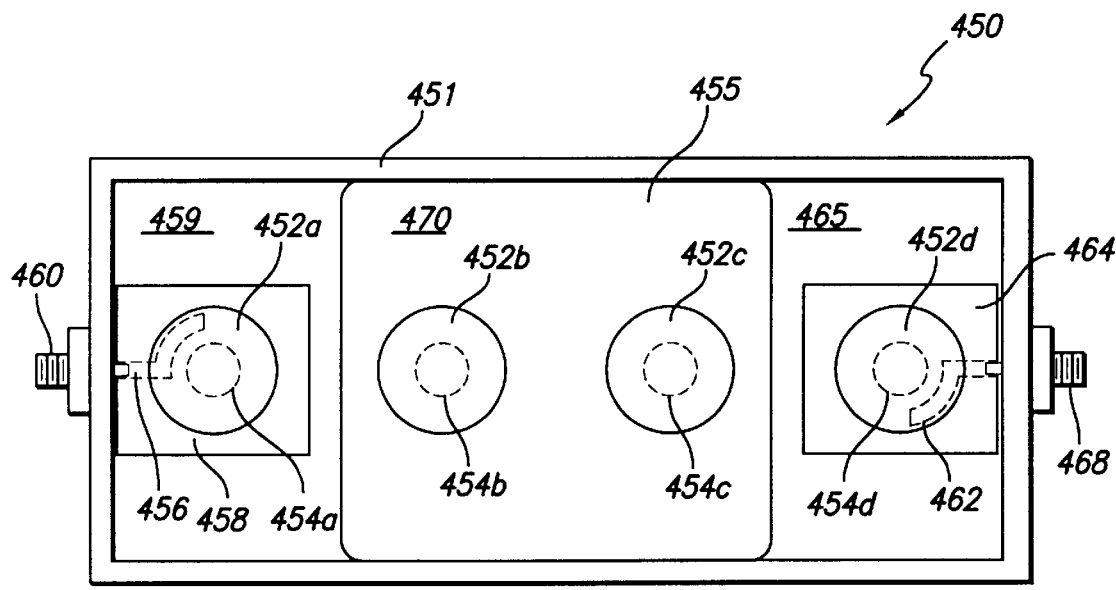
FIG. 11 is a top view of a dielectric resonator band pass filter in accordance with another aspect of the invention.

Although the dielectric resonator cavity 400 has been described for DRO applications, it shall be understood that it can also be used for other dielectric resonator applications, such as filters. Referring to FIG. 11, a top view of an example of a dielectric resonator band pass filter 450 in accordance with the invention is shown. For illustrative purposes only, the filter 450 is made to be a band pass filter having four poles. It shall be understood, however, that the number of poles, the filter type (e.g. band pass), or configuration of the filter is not critical to the invention. Thus, it can encompass band reject filters or other types of dielectric resonator filters.

The filter 450 includes a metallized or electrically conducting housing 451. Being a four-pole filter, the filter 450 includes four dielectric resonators 452a–d along with corresponding stand-offs 454a–454d (shown as dashed lines because they underlie the resonators) situated within a cavity 455 of the housing 451. The filter 450 is preferably configured such that adjacent dielectric resonators are electromagnetically coupled to each other.

The dielectric resonator filter 450 may also include an input transmission line 456 preferably formed on a substrate 458 in a microstrip configuration. The substrate 458 may be situated on a raised portion 459 on the housing 451, and alternatively include a carrier (not shown). The input transmission line 456 may also be coupled to a coaxial connector 460 that is connected on the housing 451, as it is conventionally done. Preferably, the dielectric resonator 452a along with its stand-off 454a can be situated on top of the substrate 458 such that a portion of the transmission line 456 underlie the dielectric resonator. Also in the preferred embodiment, a region of the transmission line 456 that is about electrically 90 degrees or an odd multiple thereof from the end of the line is situated below the dielectric resonator 452a, since that is the region that achieves the optimum coupling between the line and the resonator.

The dielectric resonator filter 450 may also include an output transmission line 462 preferably formed on a substrate 460 in a microstrip configuration and situated on raised portion 465 of the housing 451. These elements can be configured similar to the input of the filter including a coaxial connector 468 coupled to the transmission line 462. In actuality, the input and output may be a misnomer since the filter is a passive device, and the input can serve as the output and vice-versa.

The middle dielectric resonators 452b–c including their respective stand-offs 454b–c may be situated in a recess portion 470 of the housing 451 so that preferably all of the dielectric resonators are situated at the same height. This provides for optimum coupling between adjacent resonators. The dielectric resonators 452a–d may be connected to the corresponding standoffs 454a–d and together to the housing 451 and/or substrates 458 and 464 by suitable adhesives or mechanical devices.

In order to provide improved temperature stability for the dielectric resonator filter over a wide range of frequencies, the cavity 455 of the housing 451 is preferably dimensioned with respect to the dielectric resonators 452a–d in accordance with ranges specified by equations 1 and 2, or with the subset ranges provided by Tables 1 and 2. This would allow one housing design to be used on a multitude of filters having different frequency responses within the working frequency range of the cavity.

Figure 12:
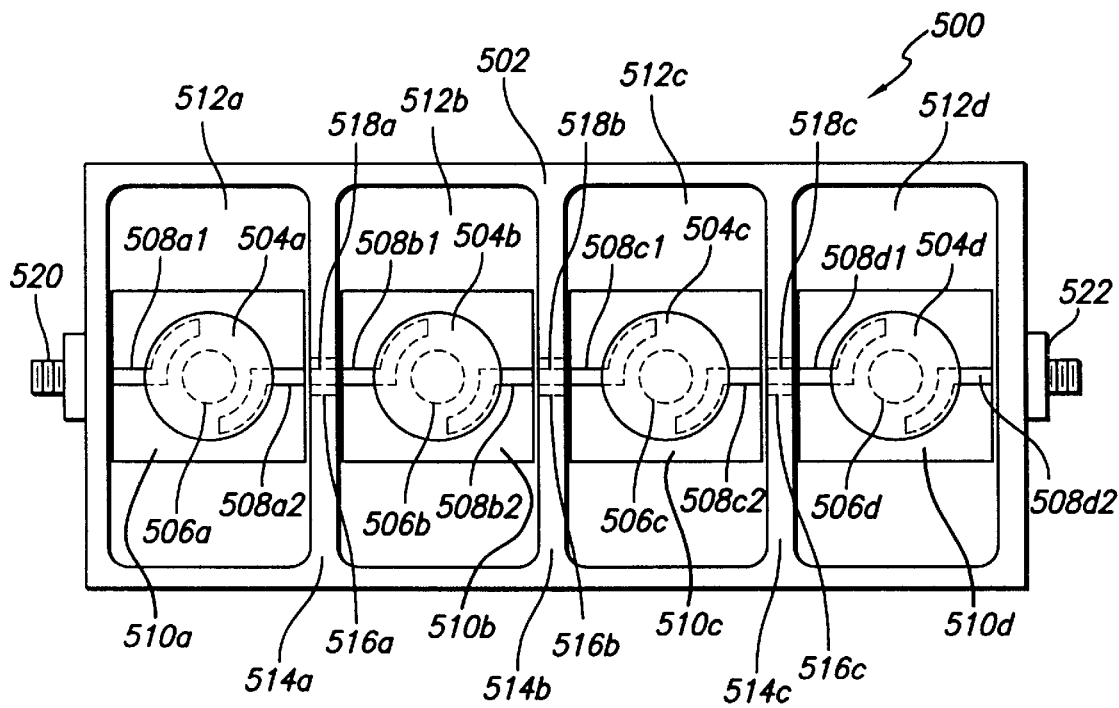
FIG. 12 is a top view of another dielectric resonator band pass filter in accordance with another aspect of the invention.

Referring to FIG. 12, a top view of another example of a dielectric resonator filter 500 in accordance with the invention is shown. The filter 500 is similar to filter 450, except each of the dielectric resonators are preferably enclosed within respective cavities and coupling between resonators is preferably by way of microstrip transmission lines, feedthroughs or the like.

More specifically, the filter 500 is also a four-pole filter in that it includes four dielectric resonators 504a–d, preferably of cylindrical shape, and preferably mounted on respective standoffs 506a–d (shown as dotted lines since they preferably underlie the respective pucks). The dielectric resonators 504a–d along with respective standoffs 506a–d are preferably mounted together and to the substrates 510a–d with suitable adhesives or mechanical devices. The substrates 510a–d preferably include respective input and output transmission lines 508a–d, preferably formed on the substrates as metallized thin-films in a microstrip configuration. As mentioned above, the fact that the transmission lines 508 are designated as input and output is a misnomer since this filter is a passive device, and therefore the inputs can serve as outputs, and vice-versa.

The housing 502 of the dielectric resonator filter 500 preferably includes four cavities 512a–d for enclosing each of the respective dielectric resonators 504a–d. The cavities 512a–d are preferably separated by traversing metallized walls 514a–514c which are preferably formed integral as part of the housing 502. The dimensions of the cavities 512a–d with respect to the corresponding dielectric resonators 512a–d are preferably designed in accordance with the ranges prescribed by equations 1 and 2, or any other the sub-ranges or subsets within the ranges prescribed by equations 1 and 2, such as those listed in Tables 1 and 2. As previously discussed, such cavity design provides for improved temperature stability over a wide frequency band, which allows a single cavity design to be used on a plurality of filters having frequency responses within the band.

The traversing walls 514*a–c* include respective openings 516*a–c* that each preferably include a feedthrough, transmission line or any coupling device for coupling between adjacent dielectric resonators 504. The filter 500 may also include suitable input and output connectors, such as coaxial connectors 520 and 522.

Temperature-Compensating Resonant Frequency Tuning Devices

Figure 1:
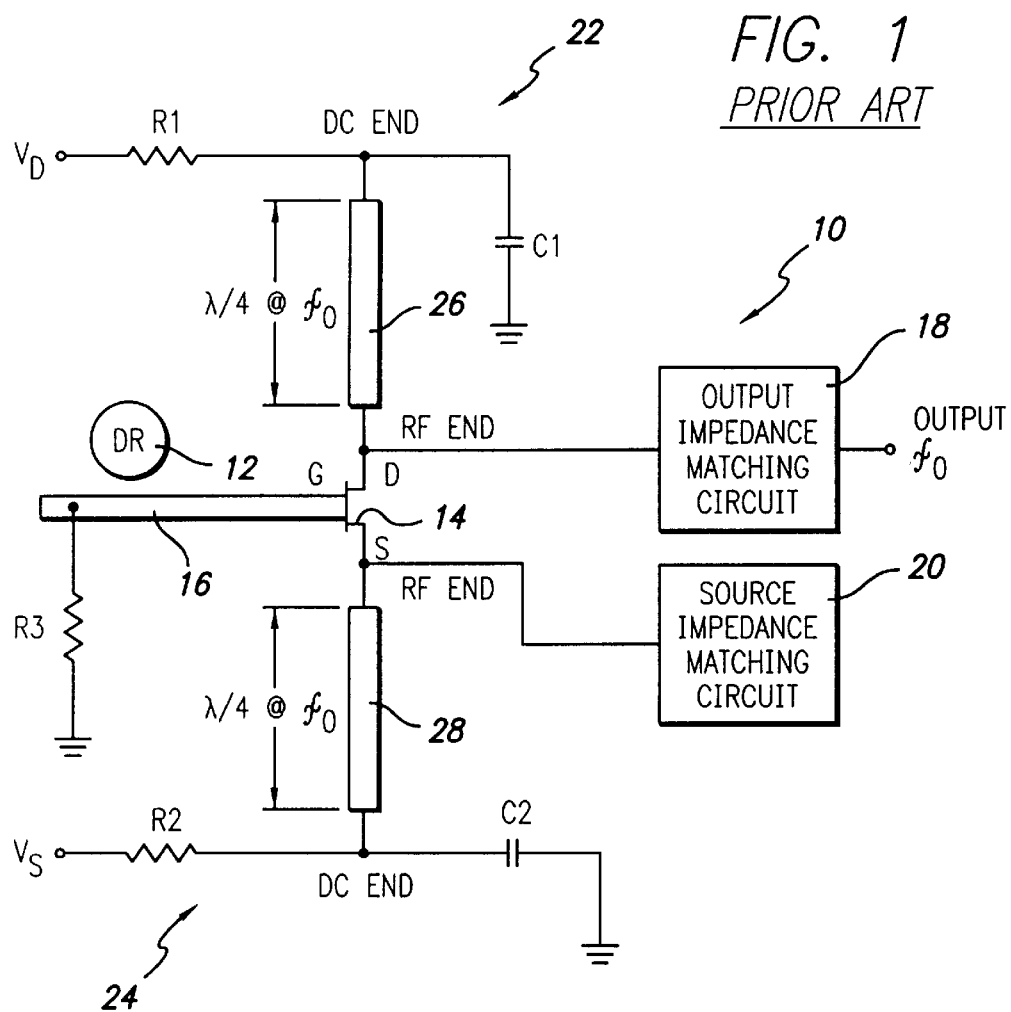
FIG. 1 is a schematic and block diagram of a prior art dielectric resonator oscillator (DRO)
Figure 2:
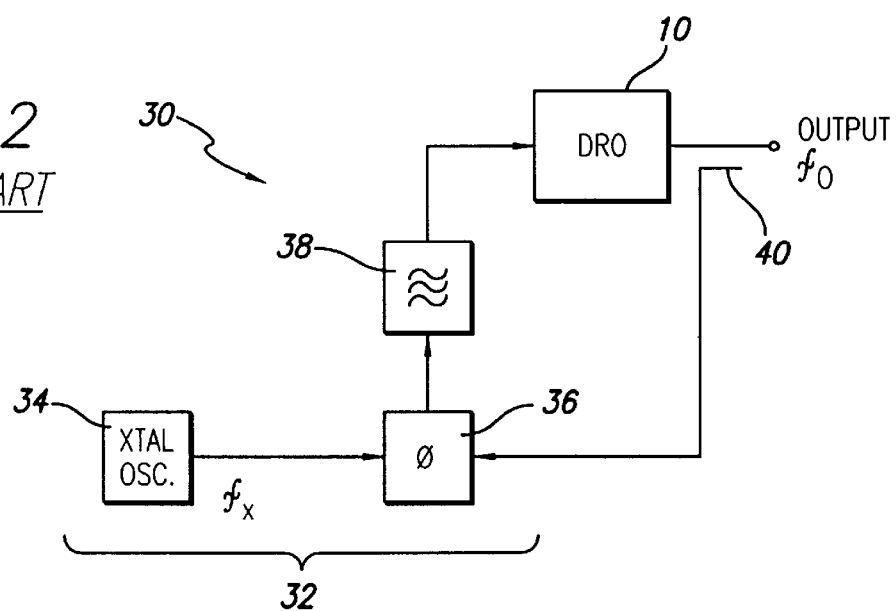
FIG. 2 is a block diagram of a prior art DRO with a temperature-compensating circuit.
Figure 3:
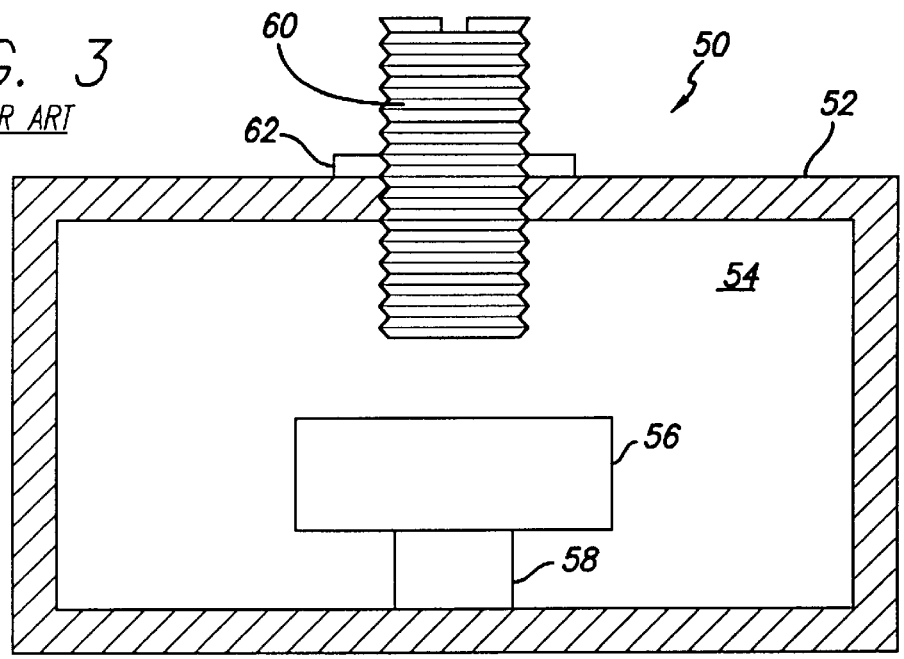
FIG. 3 illustrates a cross-sectional view of a dielectric resonator apparatus using a prior art tuning device.
Figure 13:
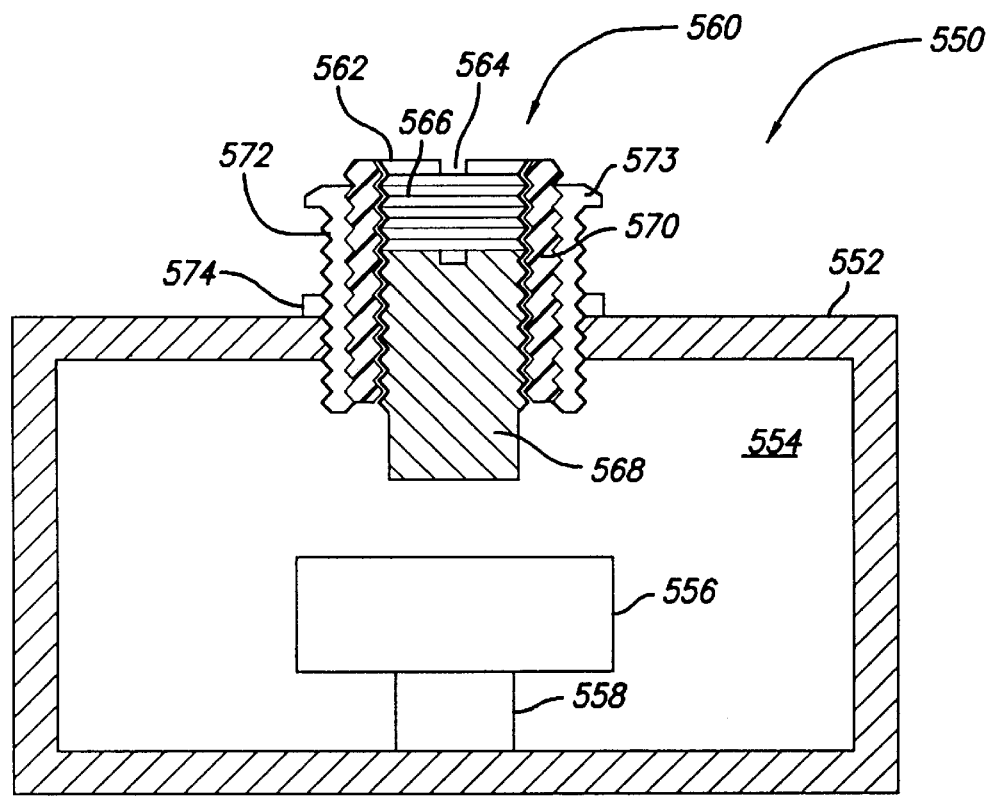
FIG. 13 illustrates a cross-sectional view of a dielectric resonator apparatus using an example tuning device as per an aspect of the invention.

FIG. 13 shows a cross-sectional view of a dielectric resonator apparatus 550 using a dielectric resonator tuning device 560 in accordance with an aspect of the invention. The term dielectric resonator apparatus 550 is used herein to refer to generally a device or circuit that requires a dielectric resonator in performing its operation. Such dielectric resonator apparatus include dielectric resonator oscillators DROs and dielectric resonator filters, such as the examples shown in FIGS. 1, 2, 4, 8, 11 and 12. However, other apparatus, circuits or devices that use a dielectric resonator can also benefit from the use of the tuning device 560 of the invention. Typical of dielectric resonator devices or circuits, the dielectric resonator apparatus 550 includes a housing 552 preferably configured to form an enclosed cavity 554. Within the cavity 554 are situated a dielectric resonator 556 and stand-off 558, which are preferably mounted on the bottom of the housing 552 or on top of a substrate (not shown).

The example dielectric resonator tuning device 560 of the invention preferably comprises several components, including a centrally-located tuning element or slug 568, a head portion 562, an inner sleeve 570, and an outer sleeve 572. The tuning element 568 is the component of the tuning device 560 that electromagnetically interacts with the dielectric resonator so that tuning and temperature stability of the resonant frequency of the dielectric resonator is provided. It is the element of the tuning device 560 that moves towards and away from the dielectric resonator 556 to shift its resonant frequency so that tuning and temperature compensation of the dielectric resonator apparatus 550 is achieved.

In the preferred embodiment, the tuning device or slug 568 is preferably in the shape of an elongated solid cylinder. However, it shall be understood that the shape of the tuning element or slug 568 is not critical to the invention, and can encompass other shapes, like solid polygonal such as rectangular, pentagon, hexagon, and so forth. The tuning element or slug 568 also need not be completely solid. In the preferred embodiment, threads are formed as part of the side walls of the tuning element 568, preferably extending from about its upper end to pass its middle region.

In addition to the tuning element 568, the tuning device 560 includes the head portion 562 that is preferably coaxially attached to the top of the tuning element. The head portion 562 allows for receipt of a mechanical device for use in positioning the end of the tuning element with respect to the dielectric resonator puck 556. In the preferred embodiment, the head portion 562 includes a slot 564 at its top portion thereof which is sized and dimensioned to receive a flat head screw for use in rotating the head portion and the tuning element 568. It shall be understood that the particular mechanical device used in positioning the tuning element 568 is not critical to the invention, and consequently, the head portion 564 can be designed to accept other types of mechanical devices, such as Phillips and Hex screw drivers, to name a few. Also in the preferred embodiment, the head portion 562 may also include threads 566 which are preferably configured to thread with the threads of the tuning element 568.

Along with the tuning element 568 and the head portion 562, the tuning device 560 includes an inner sleeve 570. As will be explained in more detail later, the inner sleeve 570 can be used to augment the movement of the tuning element 568 with respect to the dielectric resonator 556 with temperature variation. In addition, the inner sleeve 570 facilitates the positioning of the end of the tuning element 568 at the desired distance ("sweet spot") from the dielectric resonator puck 556. In the preferred embodiment, the inner sleeve 570 is in the shape of a hollow cylinder, including threads formed as part of its inner wall that are configured to rotatably mate with the threads of the head portion 562 and the tuning element 568. Another set of threads are preferably formed as part of the outer wall of the inner sleeve 570.

In addition to the tuning element 568, head portion 562, and inner sleeve 570, the tuning device 560 also includes the outer sleeve 572. As with the inner sleeve 570, the outer sleeve 572 can be used to augment the movement of the tuning element 568 with respect to the dielectric resonator 556 with temperature variation. In addition, the outer sleeve 572 also facilitates the positioning of the end of the tuning element 568 at the desired distance ("sweet spot") from the dielectric resonator 556. A further function of the outer sleeve 572 is that it provides for a rotatable attachment of the tuning device 560 to the housing 552.

In the preferred embodiment, the outer sleeve 572 is in the shape of a hollow cylinder, including threads formed as part of its inner wall that are configured to rotatably mate with the outer threads of the inner sleeve 570. Another set of threads are preferably formed as part of the outer wall of the inner sleeve 570 and are configured to rotatably engage with the housing 552 and a nut 572. The outer sleeve 570 additionally includes a lip portion 573 preferably formed at its upper end. The lip portion 573 is configured to engage with a mechanical device or human digits to facilitate rotation of the outer sleeve 572, and also to prevent rotation of the outer sleeve while the head portion 562/tuning element 568 and/or the inner sleeve 570 are being rotated. The lip portion 573 also serves as a stop to limit the movement of the top end of the outer sleeve 572 into the housing 552 and or cavity 554 when the lip portion abuts the Hex nut 574, or housing if the nut is not present. The nut 574, preferably a Hex nut, facilitates the secured attachment of the tuning device 560 to the housing 552 of the dielectric resonator apparatus 550. A tuning disk (not shown) may also be concentrically attached to the end of the tuning element 568 in order to provide a larger surface to interact with the electromagnetic waves emanating from the dielectric resonator 556.

As one of its functions, the example tuning device 560 of the invention facilitates in the tuning or selection of the desired resonant frequency of the dielectric resonator 556. Typically in the design of a dielectric resonator apparatus, the dielectric resonator is selected in a manner that its "stand alone" or unaffected resonant frequency is slightly lower than the desired resonant frequency for the resonator. The resonant frequency of a dielectric resonator can be increased by bringing a metal object in proximity to the resonator. The tuning element 568 of the tuning device 560 serves as the metal object for increasing the resonant frequency of the dielectric resonator 556. In operation, the movement of the tuning element 568 towards the dielectric resonator 568 increases the resonant frequency of the resonator.

With the tuning device 560 of the invention, three separate operations causes the movement of the tuning element 568 with respect to the dielectric resonator. First, rotating the head portion 562/tuning element 568 while keeping the inner and outer sleeves stationary, causes movement of the tuning element towards or away from the dielectric resonator 556. Second, rotating the inner sleeve 570 and the head portion 562/tuning element 568 together, while keeping the outer sleeve 572 stationary, causes movement of the tuning element towards or away from the dielectric resonator. Third, rotating the head portion 562/tuning element 568 together with the inner and outer sleeves 570–572, causes movement of the tuning element towards or away from the dielectric resonator 556.

One advantage of having three separate operations for controlling the position of the tuning element 568 with respect to the dielectric resonator is that the three rotating operations discussed above can be made to provide coarse, medium and fine movement of the tuning element with respect to the dielectric resonator. For example, the threads of the head portion 562/tuning element 568 and the inner threads of the inner sleeve 570 can be made to have a relatively small pitch so that rotation of the head portion/tuning element provide fine movement of the tuning element towards and away from the dielectric resonator. The outer threads of the inner sleeve 570 and the inner threads of the outer sleeve 572 can be made to have a medium-size pitch so that rotation of the head portion/tuning element and inner sleeve provide medium movement of the tuning element 568 towards and away from the dielectric resonator. The outer threads of the outer sleeve 572 and the top wall of the housing 552 can be made to have a relatively large pitch so that rotation of all the elements together causes coarse movement of the tuning element 568 towards and away from the dielectric resonator.

Not only does the example tuning device 560 of the invention serve to adjust the position of the end of the tuning element 568 with respect to the dielectric resonator in order to tune its resonant frequency, it can also serve to stabilize the resonant frequency of the dielectric resonator with changes in the environment temperature. For example, as temperature increases, the dielectric resonator 556 expands. Since the resonant frequency of a dielectric resonator is inversely proportional to the size of the dielectric resonator, the expansion of the dielectric resonator 556 causes its resonant frequency to decrease. Thus, as temperature increases, the resonant frequency of the dielectric resonator decreases. Similarly, as temperature decreases, the dielectric resonator 556 contracts, and consequently causes the resonant frequency to increase.

Also with an increase in temperature, the housing 552 of the dielectric resonator apparatus 550 expands. This causes the movement of the housing walls away from the dielectric resonator 556. Since bringing a metal object in proximity to a dielectric resonator tends to increase its resonant frequency, the housing walls moving away from the dielectric resonator as temperature increases tends to lower the resonant frequency. Thus, as temperature increases, there are two actions that tend to cause the resonant frequency of the dielectric resonator 556 to decrease, i.e. the expansion of both the dielectric resonator and the housing 552. Similarly, as temperature decreases, there are two actions that tend to cause the resonant frequency of the dielectric resonator to increase, i.e. the contraction of the dielectric resonator and the contraction of the housing 552.

To counteract these two actions that causes variation in the resonant frequency of the dielectric resonator 556 as temperature changes, the example tuning device 560 of the invention includes three elements that can assist in stabilizing the resonant frequency with temperature changes. These elements include the tuning element 568, the inner sleeve 570, and the outer sleeve 572. In operation, as temperature rises within the operating temperature range of the dielectric resonator apparatus, the tuning element 568, inner sleeve 570, and outer sleeve expand linearly with temperature. The expansion of these elements causes movement of the end of the tuning element 568 towards the dielectric resonator 556. Because the tuning element 568 acts as a metal object in proximity to a dielectric resonator, the movement of this element towards the resonator tends to raise or increase the resonant frequency of the dielectric resonator 556, which counteracts the actions of the expansion of the dielectric resonator and housing 556 in tending to lower or decrease the resonant frequency.

Similarly, as temperature decreases within the operating temperature range of the dielectric resonator apparatus 550, the tuning element 568, inner sleeve 570, and outer sleeve 572 contract linearly with temperature. The contraction of these elements causes movement of the end of the tuning element 568 away from the dielectric resonator 556. Because the tuning element 568 acts as a metal object in proximity to a dielectric resonator, the movement of this element away from the dielectric resonator tends to lower or decrease the resonant frequency of the dielectric resonator 556, which counteracts the actions of the contractions of the dielectric resonator 556 and housing 552 that tend to increase the resonant frequency.

One particular advantage of the example tuning device 560 of the invention is the large range of movement of the tuning element 568 with changes in temperature that can be achieved with the device. The reason for this is that the cumulative expansions of the outer sleeve 572, inner sleeve 570 and the tuning element 568 can be made to contribute to the movement of the tuning element 568. Since three elements can be made to contribute to the movement of the end of the tuning element 568 with respect to the dielectric resonator 556, a large range of movement can be achieved. In the preferred embodiment, the selection of the materials for the outer sleeve 572, inner sleeve 570, and tuning element 568 is such that the range of movement of the tuning element achieved is greater than what is required to provide the desired temperature stability of the resonant frequency of the dielectric resonator 556. In other words, the materials are selected to overcompensate for the resonant frequency drift due to temperature changes. Proper adjustment of the tuning device 560 to provide the desired temperature compensation is explained as follows.

Figure 14:
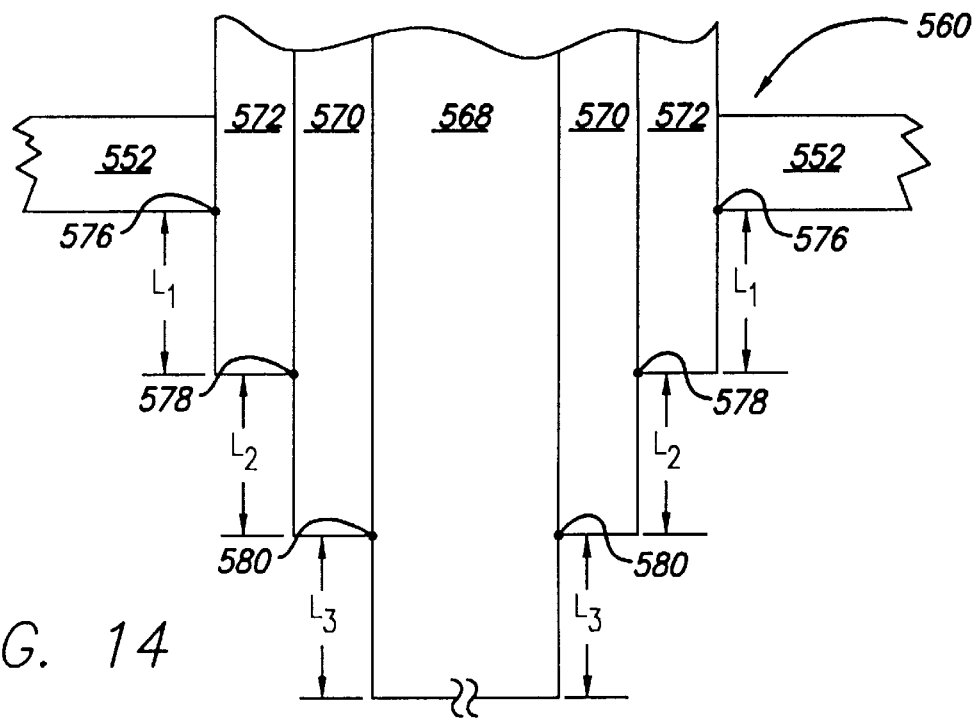
FIG. 14 illustrates a blow-up view of the tuning portion of the example tuning device shown in FIG. 13.

Another advantage of the example tuning device 560 of the invention is its versatility and ease in obtaining the desired movement of the end of the tuning element 568 to provide the desired temperature stability of the resonant frequency of the dielectric resonator 556. The movement of the end of the tuning element 568 is not only governed by the temperature expansion coefficients of the outer sleeve 572, inner sleeve 570, and tuning element 568, it is also governed by the length of their respective materials below their respective contacting points to their respective adjacent outer elements. FIG. 14 is used to better explain this principle.

FIG. 14 shows a "blow up" view of the lower portion of the example tuning device 560 of the invention shown in FIG. 13. The threads of the housing 552, outer sleeve 572, inner sleeve 570, and tuning element 568 are not shown for simplicity sake. In this simplified view of the example tuning device 560, the regions of attachment or abutment of the elements to adjacent elements can be represented by nodes, i.e. equivalent single contact points. For instance, the attachment or abutment of the outer sleeve 572 with the housing 552 can be represented as node 576. Similarly, the attachment or abutment of the inner sleeve 570 with the outer sleeve 572 can be represented by node 578. Likewise, the attachment or abutment of the tuning element 568 with the inner sleeve 568 can be represented by node 580.

During temperature changes, the regions of attachment or abutments of the various elements of the tuning device 560, i.e. nodes 576, 578 and 580, typically remain substantially fixed or stationary with respect to each other, along the longitudinal axis of the elements. However, for regions of the elements not at the attachment or abutment regions, such as the regions below the nodes 576, 578, and 580, the regions expand or contract in the longitudinal direction relative to the nodes. This expansion or contraction of these regions of the elements below the nodes is a function of the temperature expansion coefficients of their respective materials, and also of their respective lengths. For example, the outer sleeve 572 expands or contracts with changes in temperature below node 576 substantially linearly proportional to the length L1. Similarly, the inner sleeve 570 expands or contracts with changes in temperature below node 578 substantially linearly proportional to the length L2. Likewise, the tuning element 568 expands or contracts with temperature below node 580 substantially linearly proportional to the length L3.

The desired movement of the tuning element 568 with changes in temperature can be achieved by adjusting the lengths L1–3 of the outer sleeve 572, inner sleeve 570, and tuning element 568 that lie below nodes 576, 578 and 580 respectively. This can be easily performed with the example tuning device 560 of the invention by rotating the outer sleeve to change length L1, rotating the inner sleeve 570 with respect to the outer sleeve 572, or vice-versa, to change length L2, and rotating the head portion 562/tuning element 568 with respect to the inner sleeve, or vice-versa, to change length L3. Since the tuning device 560 provides three variables for controlling the rate of movement of the tuning element 568 with changes in temperature, precision as to the desired movement can be achieved.

Figure 15:
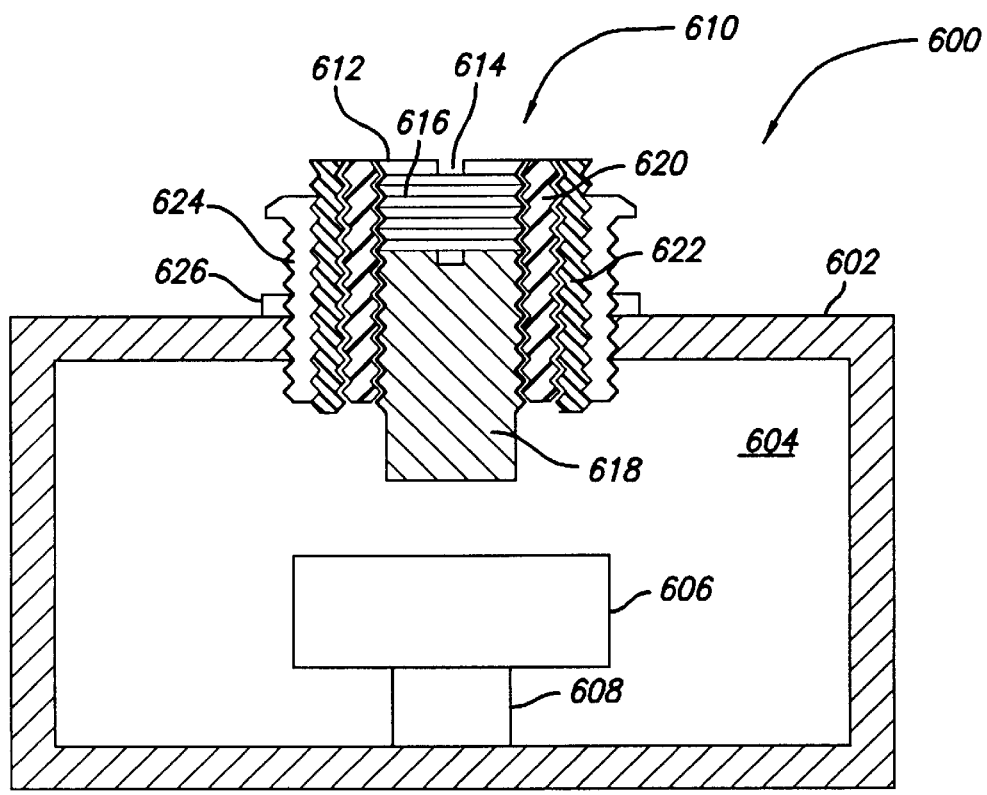
FIG. 15 illustrates a cross-sectional view of a dielectric resonator apparatus using another example of a tuning device as per another aspect of the invention.

FIG. 15 shows a cross-sectional view of another dielectric resonator apparatus 600 that uses another embodiment of a tuning device 610 in accordance with the invention. Similar to the example dielectric resonator apparatus 550 of the invention, the example dielectric resonator apparatus 600 of the invention includes a housing 602 preferably configured to form a cavity 604 for housing a dielectric resonator 606 and corresponding stand-off 608 preferably situated at the bottom wall of the housing, or alternatively, on a substrate (not shown). Similar to the example tuning device 560 of the invention, the example tuning device 610 of the invention includes a head portion 612 having a slot 614 and threads 616, a tuning element or slug 618 attached to or integral with the head portion 616, and inner and outer sleeves 620 and 624. A nut 626, preferably a Hex nut, is also provided to securely attach the tuning device 610 to the housing 602.

In addition to the inner and outer sleeves 620 and 624, the example tuning device 610 of the invention further includes an intermediate sleeve 622 situated between the inner and outer sleeves. In the preferred embodiment, the sleeves 620, 622, and 624 and the tuning element 618 are substantially cylindrically shaped and concentric with each other. The tuning element 618 is preferably solid throughout, whereas the sleeves 620, 622, and 624 are configured as hollow shells to encompass the adjacent sleeve(s) and/or tuning element. Also the threads of the sleeves 620, 622 and 624 and the tuning element 618 can have different pitches to achieve coarse, medium, or fine movement of the tuning device by rotation of these elements as discussed above.

One advantage of the additional intermediate sleeve 622 is that an even larger range of movement of the tuning element 618 with changes in temperature can be potentially achieved over that of the tuning device 610. The reasons being is that there are four elements in the tuning device 610 contributing to the movement of the tuning element 618, namely, the sleeves 620, 622 and 624, and the tuning element 618. Another advantage of the example tuning device 610 of the invention is that it includes four parameters for adjustment to precisely provide the desired movement of the tuning element 618 with temperature, so that the desired temperature stability of the resonant frequency of the dielectric resonator 606 is achieved. These parameters includes the lengths of the sleeves and tuning element below there respective outward adjacent contact points or nodes. It shall be understood that additional sleeves may be added to the tuning device 610 in order to provide a larger range of movement of the tuning element and better control on the rate of its movement with changes in temperature.

The tuning devices 550 and 610 of the invention can be used on a circuit, device or apparatus that includes a dielectric resonator in performing its functions. Such circuit, device or apparatus can include dielectric resonator oscillators (DROs), such as the ones described herein and/or depicted in FIGS. 1, 2, 4 and 8, to name a few. Such circuit, device or apparatus can also include dielectric resonator filters, such as the ones described herein and/or depicted in FIGS. 11–12, to name a few. The tuning devices 550 and 610 can also be used with the multiple-frequency dielectric resonator cavity 400 of the invention in order to be used with a line of dielectric resonator apparatus operating at a plurality of distinct frequencies or frequency ranges.

High-Q and Low Loss RF/Microwave Oscillator with an Inherent Temperature Stability Property As discussed earlier, dielectric resonator oscillators (DROs) have grown in popularity because of their superior high-Q, low-loss, and low phase noise properties. However, their attractiveness is somewhat tarnished because of their inherent susceptibility to environment temperature variation. What would be optimal is to have an RF/Microwave oscillator that has the high-Q, low-loss, and low phase noise characteristics of a DRO, with the additional characteristic that it is not highly susceptible to temperature variation, or that it has an inherent temperature stable property. Such an oscillator would reduce engineering time in avoiding design of temperature compensating techniques, reduce manufacturing time in foregoing the implementation of temperature compensation devices, circuits or structures, reduce inventory and logistics due to less components, and increase reliability also due to less components. Such an oscillator is provided herein as follows.

Figure 16:
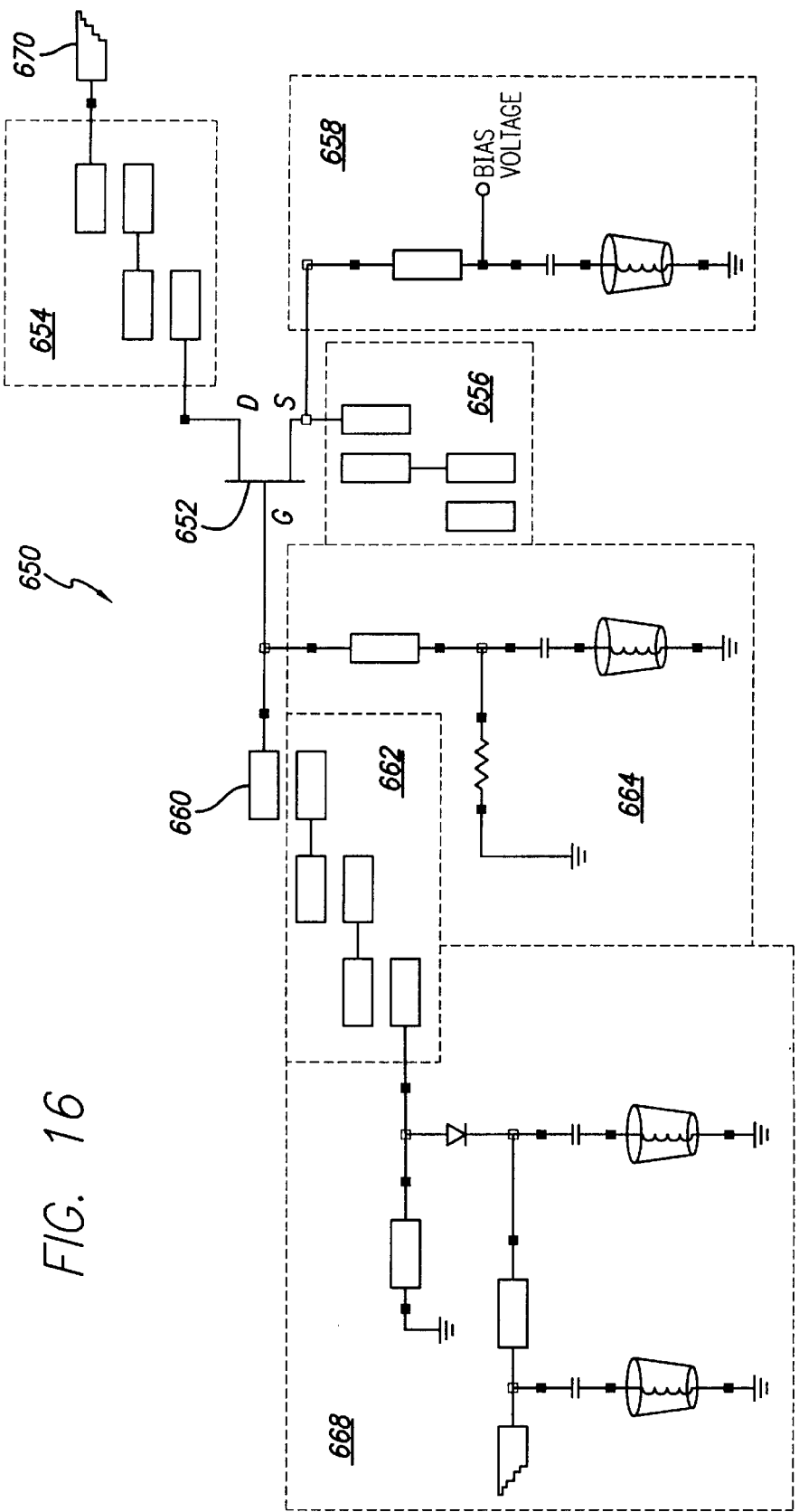
FIG. 16 illustrates a schematic of an example RF/Microwave oscillator in accordance with another aspect of the invention.

FIG. 16 shows a schematic of an example RF/Microwave oscillator 650 in accordance with an aspect of the invention. The RF/Microwave oscillator 650 preferably includes an active device 652, a drain output line circuit 654, a series feedback line circuit 656, at least one bias circuit 658 for the active device, a resonator line 660, a tune line or resonator circuit 662, a FET gate return circuit 664, and a frequency tuning circuit 668. In the preferred embodiment, the active device 652 comprises a metal-semiconductor field effect transistor (MESFET), but can include other types of active devices. For example, the active device 652 can include a high electron mobility transistor (HEMPT) or more specifically, pseudo-morphic high electron mobility transistor (PHEMPT). Alternatively, the active device 652 can be of a bi-polar transistor type, such as a hetero-junction bi-polar transistor. The particular active device is not critical to the invention.

In the preferred embodiment, the drain (D) of the MESFET 652 is coupled to the drain output coupled line circuit 654. The drain output coupled line circuit 654 is preferably comprised of at least a pair of coupled transmission lines. However, if improved performance is desired, as will be explained later, multiple cascaded pairs of coupled transmission lines can be employed. The example RF/Microwave oscillator 650 of the invention is shown to have a drain output line circuit 654 that comprises two cascaded pairs of coupled transmission lines. The drain output line circuit 654 is preferably designed to provide substantially optimal impedance matching and coupling to an output transmission line 670 at the operating frequency of the oscillator 650. If the active device 652 is not a FET or HEMPT, the appropriate terminal of the device is to be coupled to the drain output line circuit 654, as understood by those skilled in the art.

Also in the preferred embodiment, the source (S) of the MESFET 652 is coupled to the series feedback line circuit 656. The series feedback line circuit 656 is preferably comprised of at least a pair of coupled transmission lines with an open end. However, if improved performance is desired, as will be explained later, multiple cascaded pairs of coupled transmission lines can be employed. The example RF/Microwave oscillator 650 of the invention is shown to have a series feedback line circuit 656 that comprises two cascaded pairs of coupled lines. The feedback series line circuit 654 is preferably designed to provide optimal coupling back of RF energy to the input of the oscillator at the operating frequency of the oscillator 650. If the active device 652 is not a FET or HEMPT, the appropriate terminal of the device is to be coupled to the series feedback line 656, as understood by those skilled in the art.

In order to provide a bias voltage for the MESFET 652 of the example RF/Microwave oscillator 650 of the invention, the bias circuit 658 is included to supply the needed direct current (dc) bias voltage to the MESFET with minimal effects on the RF/Microwave energy generated by the oscillator. This is typically done by including a quarterwave line having one end connected to the source (S) of the MESFET 652 and the other end connected to an RF bypass capacitor coupled to ground via suitable means, such as a via hole. As it is conventionally known, the bias voltage is applied to the node interconnecting the quarterwave line and the RF bypass capacitor. In the alternative, the bias circuit 658 can be made frequency-adjustable in the same manner as frequency-adjustable biasing circuits described herein and/ or depicted in FIGS. 4–9.Similar bias circuits can also be employed for supplying dc bias voltage to other terminals of the MESFET, if desired. If the active device 652 is not a FET or HEMPT, the appropriate terminal of the device is to be coupled to the bias circuit 658, as understood by those skilled in the art.

In the preferred embodiment, the gate (G) of the MESFET 652 is coupled to the FET gate return circuit 664. As explained earlier, the gate return circuit 664 provides a path to ground for unwanted positive charges that pass through the Schottky diode junction of the gate during the operation of the MESFET. The gate return circuit 664 preferably comprises a quarterwave line coupled to a gate return resistor and an RF bypass capacitor, both of which are coupled to ground. Preferably, the gate return resistor is characterized by a high resistance, such as, for example, about 10 kilo Ohms. It is also preferred that the RF bypass capacitor have a susceptance that does not exceed about one to two Ohms. Alternatively, the gate return resistor circuit 664 can be frequency-adjustable similar to the gate return circuits 312 and 350 described herein and shown in FIGS. 8 and 9.

In the preferred embodiment, the gate (G) of the MESFET 652 is coupled to the input resonator line 660, as it is conventionally done for DROs. The input resonator line 660, in turn, is preferably coupled to a tune line or resonator circuit 662 comprising at least a pair of coupled transmission lines. If improved performance in the form of higher-Q and low-loss is desired, it is preferred that multiples cascaded pairs of coupled transmission lines are used to configure the resonator structure. The example RF/Microwave oscillator 650 of the invention is shown to have a tune line of resonator circuit 66 that includes three cascaded pairs of coupled transmission lines. The coupled transmission lines are preferably designed to resonate at the operating frequency of the oscillator 650. If the active device 652 is not a FET or HEMPT, the appropriate terminal of the device is to be coupled to the input resonator line 660, as understood by those skilled in the art.

In the preferred embodiment, the tune line or resonator circuit 660 is coupled to the frequency tuning circuit 668. The frequency tuning circuit 668 allows external control of the resonant frequency of the tune line or resonator circuit 662. Preferably, the stimuli for providing the external frequency control is a tuning voltage. In the preferred embodiment, the frequency tuning circuit 668 comprises a varactor diode having an anode coupled to the tune line or resonator circuit 662 and a quaterwave line coupled to ground. The cathode of the varactor is coupled to an RF bypass capacitor connected to ground and to a second quarterwave line. The second quaterwave line is, in turn, coupled to a tune voltage input line and a second RF bypass capacitor connected to ground. The tuning voltage is applied to the frequency tuning circuit 668 by way of the tune voltage input line. Adjustment of the tuning voltage causes changes in the impedance of the varactor diode, which in turn, affects the resonant frequency of the tune line or resonator circuit 662.

In the preferred embodiment, the various circuits of the RF/Microwave oscillator 650, namely the drain output line circuit 654, the series feedback line circuit 656, the biasing circuit 658, the gate return circuit 664, the input resonator line 660, the tune line or resonator circuit 662, and the frequency tuning circuit 668 may be formed on a suitable substrate, such as alumina, quartz, Duriode® or semiconductor substrates, preferably in a microstrip form. In this configuration, the quarterwave, coupled and input resonator transmission lines are preferably formed as metallized thin-film layers deposited on the substrate. The RF capacitors may of a thin-film overlay type, interdigital type, chip type or other suitable types formed or mounted on the substrate. The grounds are preferably formed of metallized via holes, but can include wrap-arounds, wire or ribbon bond connection to a grounded surface. It shall be understood that these circuits can also be configured into other mediums, including stripline, co-planer microstrip, and suspended stripline, to name a few.

The advantage of the example RF/Microwave oscillator 650 of the invention is that it can be easily configured to perform with a high-Q, low-loss, and low phase noise characteristic comparable to that of a DRO. Specifically, the overall Q of the RF/Microwave oscillator 650 is affected by the individual Qs of the tune line or resonator circuit 662, drain output line circuit 654, and the series feedback line circuit 656. The Qs of these circuits are, in turn, proportional to the number of cascaded pairs of coupled transmission lines. That is, the more cascaded pairs of coupled transmission lines in these circuits, the higher the Q for each of these circuits. By including a sufficient number of cascaded pairs of coupled transmission lines for each of these circuits, the high-Q, low-loss and phase noise performance of a DRO can be achieved.

Such as RF/Microwave oscillator 650 enjoys the performance characteristic of a DRO, without the adverse affect of having a dielectric resonator that has a resonant frequency highly susceptible to temperature variations. Since a dielectric resonator is not required by the RF/Microwave oscillator 650, there is no need to provide temperature compensation devices or structure to achieve the desired temperature stability. This translates to reduce engineering time, manufacturing time, cost, inventory, logistics and an increase in the reliability of the oscillator.

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

What is claimed is:

1. An RF/Microwave oscillator, comprising:
   an active device including first, second and third ports;
   a dc biasing circuit coupled to one of said first, second and third ports;
   a resonator circuit coupled to said first port, and comprising a first pair of coupled transmission lines;
   a feedback circuit coupled to said second port, and comprising a second pair of coupled transmission lines; and
   an output circuit coupled to said third port, and comprising a third pair of coupled transmission lines.

2. The RF/Microwave oscillator of claim 1, wherein said active device is of a field effect transistor type, and said first, second and third ports are said gate, source and drain of said transistor.

3. The RF/Microwave oscillator of claim 2, wherein said resonator circuit comprises a first set of cascaded pairs of coupled transmission lines.

4. The RF/Microwave oscillator of claim 3, wherein said feedback circuit comprises a second set of cascaded pairs of coupled transmission lines.

5. The RF/Microwave oscillator of claim 4, wherein said output circuit comprises a third set of cascaded pairs of coupled transmission lines.

6. The RF/Microwave oscillator of claim 5, wherein said first, second and third sets of cascaded pairs of coupled transmission lines are formed on a substrate in a microstrip configuration.

7. The RF/Microwave oscillator of claim 1, wherein said dc biasing circuit is frequency-adjustable.

8. The RF/Microwave oscillator of claim 2, further including a gate return circuit coupled to the gate of said field effect transistor.

9. The RF/Microwave oscillator of claim 8, wherein said gate return circuit is frequency adjustable.

10. The RF/Microwave oscillator of claim 1, further comprising a frequency adjusting circuit coupled to said resonator circuit for causing its resonant frequency to change in response to an input stimuli.

* * * * *